(12) United States Patent
Kodama

(10) Patent No.: US 11,817,337 B2
(45) Date of Patent: Nov. 14, 2023

(54) SUBSTRATE PROCESSING SYSTEM AND SUBSTRATE PROCESSING METHOD

(71) Applicant: Tokyo Electron Limited, Tokyo (JP)

(72) Inventor: Munehisa Kodama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 17/268,116

(22) PCT Filed: Jul. 17, 2019

(86) PCT No.: PCT/JP2019/028108
§ 371 (c)(1),
(2) Date: Feb. 12, 2021

(87) PCT Pub. No.: WO2020/039802
PCT Pub. Date: Feb. 27, 2020

(65) Prior Publication Data
US 2021/0327738 A1 Oct. 21, 2021

(30) Foreign Application Priority Data
Aug. 23, 2018 (JP) ................. 2018-156673

(51) Int. Cl.
*H01L 21/677* (2006.01)
*H01L 21/67* (2006.01)
*H01L 21/687* (2006.01)

(52) U.S. Cl.
CPC .. *H01L 21/67718* (2013.01); *H01L 21/67028* (2013.01); *H01L 21/67092* (2013.01); *H01L 21/68714* (2013.01)

(58) Field of Classification Search
None
See application file for complete search history.

(56) References Cited

U.S. PATENT DOCUMENTS 7,335,092 B1 * 2/2008 Severson ............... B24B 37/30
451/388
2009/0061739 A1 * 3/2009 Jeong .................... B24B 37/345
451/103

FOREIGN PATENT DOCUMENTS

JP 2015207622 A 11/2015

OTHER PUBLICATIONS

International Search Report of PCT/JP2019/028108 dated Oct. 21, 2019.

* cited by examiner

*Primary Examiner* — Roberts P Culbert
(74) *Attorney, Agent, or Firm* — Shih IP Law Group, PLLC.

(57) ABSTRACT

A substrate processing system includes a first main surface grinding device configured to grind, while holding a substrate from below with a first main surface of the substrate facing upwards, the first main surface of the substrate; a first inverting device configured to invert the substrate ground by the first main surface grinding device; and a second main surface grinding device configured to grin, while holding the ground first main surface of the substrate from below with a second main surface of the substrate facing upwards, the second main surface of the substrate.

20 Claims, 24 Drawing Sheets

SUBSTRATE PROCESSING SYSTEM AND SUBSTRATE PROCESSING METHOD

TECHNICAL FIELD

The various aspects and exemplary embodiments described herein pertain generally to a substrate processing system and a substrate processing method.

BACKGROUND

A processing device described in Patent Document 1 is equipped with a cassette placing unit, a carry-in/out robot, a temporary placing unit, a transfer robot, a traveling unit, a grinding unit and a cleaning unit. First, the carry-in/out robot carries an unprocessed plate-shaped work out of a cassette and transfers the work into the temporary placing unit. Then, the transfer robot and the traveling unit transfer the plate-shaped work to the grinding unit and the cleaning unit sequentially. Thus, rough grinding, finish grinding and cleaning are performed sequentially.

PRIOR ART DOCUMENT

Patent Document 1: Japanese Patent Laid-open Publication No. 2015-207622

DISCLOSURE OF THE INVENTION

Problems to be Solved by the Invention

Means for Solving the Problems

In one exemplary embodiment, a substrate processing system includes a first main surface grinding device configured to grind, while holding a substrate from below with a first main surface of the substrate facing upwards, the first main surface of the substrate; a first inverting device configured to invert the substrate ground by the first main surface grinding device; and a second main surface grinding device configured to grin, while holding the ground first main surface of the substrate from below with a second main surface of the substrate facing upwards, the second main surface of the substrate.

Effect of the Invention

DETAILED DESCRIPTION

Figure 1:
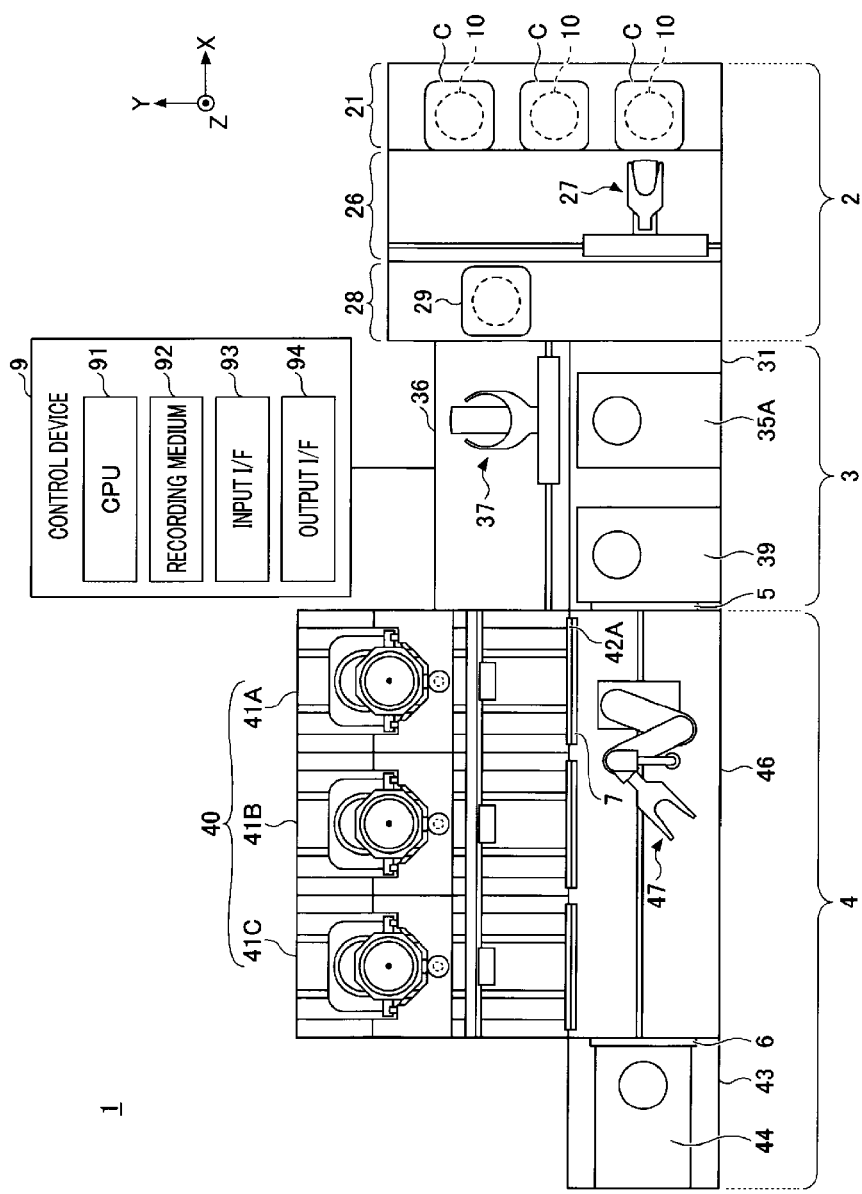
FIG. 1 is a top view illustrating a substrate processing system according to an exemplary embodiment.

Hereinafter, exemplary embodiments of the present disclosure will be described with reference to the accompanying drawings. In the drawings, same or corresponding parts will be assigned same or corresponding reference numerals, and redundant description may be omitted. In the following description, the X-axis direction, the Y-axis direction and the Z-axis direction are orthogonal to each other. The X-axis direction and the Y-axis direction are horizontal directions, and the Z-axis direction is a vertical direction. Further, the term "downwards" refers to vertically downward direction (negative Z-axis direction), and the term "upwards" refers to vertically upward direction (positive Z-axis direction). Also, the negative Y-axis direction is referred to as forwards, and the positive Y-axis direction is referred to as backwards.

Figure 2:
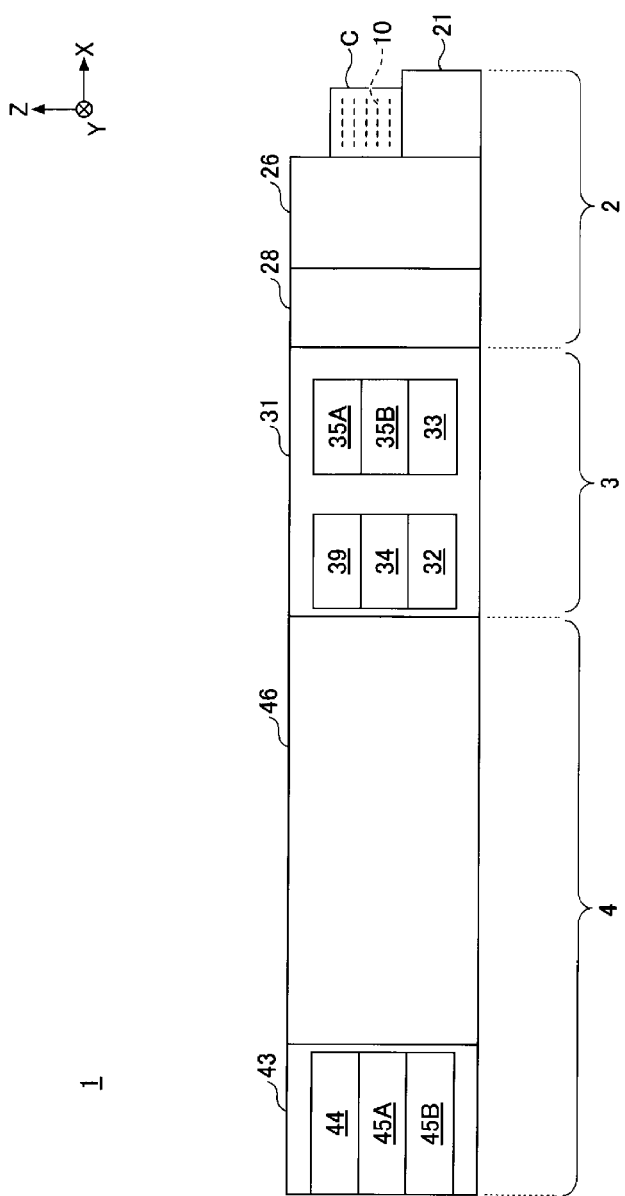
FIG. 2 is a front view illustrating the substrate processing system according to the exemplary embodiment.

FIG. 1 is a top view illustrating a substrate processing system according to an exemplary embodiment. FIG. 2 is a front view illustrating the substrate processing system according to the exemplary embodiment. A substrate processing system 1 includes a carry-in/out station 2, a first processing station 3, a second processing station 4 and a control device 9. The carry-in/out station 2, the first processing station 3 and the second processing station 4 are arranged in this order from the positive X-axis direction to the negative X-axis direction.

The carry-in/out station 2 includes a carrier placing section 21, a transfer section 26 and a delivery section 28. A plurality of carriers C is arranged in series along the Y-axis direction and placed in the carrier placing section 21. Each of the plurality of carriers C accommodates a plurality of substrates 10 horizontally. Each substrate 10 is a semiconductor substrate, such as a silicon wafer. The substrate 10 is prepared by, for example, slicing an ingot. The substrate 10 has a first main surface 11 and a second main surface 12 facing each other (see FIG. 4A). Each of the first main surface 11 and the second main surface 12 has irregularities.

The transfer section 26 is placed next to the carrier placing section 21 and placed in the negative X-axis direction of the carrier placing section 21. Further, the transfer section 26 is placed next to the delivery section 28 and placed in the positive X-axis direction of the delivery section 28. A transfer device 27 is provided inside the transfer section 26. The transfer device 27 includes a holding mechanism configured to hold the substrate 10. The holding mechanism is movable in the horizontal direction (in both the X-axis direction and the Y-axis direction) and the vertical direction, and pivotable around a vertical axis. The transfer device 27 transfers the substrate 10 between the carrier C placed in the carrier placing section 21 and the delivery section 28.

The delivery section 28 is placed in the negative X-axis direction of the transfer section 26 and the positive X-axis direction of the first processing station 3. The delivery section 28 includes a first transition device 29. The first transition device 29 is configured to temporarily accommodate the substrate 10. In the delivery section 28, the placement and the number of the first transition device 29 can be arbitrarily selected. Also, the carry-in/out station 2 may not include the delivery section 28, and in this case, the first transition device 29 of the delivery section 28 is placed in a processing block 31 of the first processing station 3, and the processing block 31 is placed next to the transfer section 26.

The first processing station 3 includes the processing block 31 and a transfer section 36. The processing block 31 includes a second transition device 32, a planarizing device 33, a cleaning device 34, etching devices 35A and 35B and an inverting device 39. The second transition device 32 is configured to temporarily accommodate the substrate 10. The planarizing device 33 is configured to form a planarization layer on the second main surface 12 of the substrate 10. The cleaning device 34 is configured to clean the second main surface 12 of the substrate 10. The etching device 35A is configured to etch the second main surface 12 of the substrate 10. The etching device 35B is configured to etch the first main surface 11 of the substrate 10. The etching device 35A may also be referred to as a second main surface etching device, the etching device 35B may also be referred to as a first main surface etching device. The inverting device 39 is configured to invert the substrate 10.

The second transition device 32 and the cleaning device 34 are placed next to a transfer section 46 of the second processing station 4 and placed in the positive X-axis direction of the transfer section 46 to allow the transfer device 47 of the second processing station 4 to deliver the substrate 10. The second transition device 32 and the cleaning device 34 are stacked along the Z-axis direction to reduce an installation area of the processing block 31. Also, the inverting device 39 is stacked with the second transition device 32 and the cleaning device 34 along the Z-axis direction.

Also, in the processing block 31, the placement and the number of the second transition device 32, the planarizing device 33, the cleaning device 34, the etching devices 35A and 35B and the inverting device 39 can be arbitrarily selected.

The transfer section 36 is placed next to the first transition device 29 of the carry-in/out station 2 and placed in the negative X-axis direction of the first transition device 29. Also, the transfer section 36 is placed next to the processing block 31 and placed in the positive Y-axis direction of the processing block 31. A transfer device 37 is provided inside the transfer section 36. The transfer device 37 includes a holding mechanism configured to hold the substrate 10. The holding mechanism is movable in the horizontal direction (in both the X-axis direction and the Y-axis direction) and the vertical direction, and pivotable around a vertical axis. The transfer device 37 transfers the substrate 10 with respect to the first transition device 29 of the carry-in/out station 2 and the processing block 31 of the first processing station 3.

The second processing station 4 includes a first processing block 40, a second processing block 43 and the transfer section 46. The first processing block 40 and the second processing block 43 are placed next to the transfer section 46. The first processing block 40 is placed in the positive Y-axis direction of the transfer section 46, and the second processing block 43 is placed in the negative X-axis direction of the transfer section 46.

The first processing block 40 includes three processing devices 41A, 41B and 41C. The three processing devices 41A, 41B and 41C are arranged along the X-axis direction. The processing device 41A is configured to grind the first main surface 11 of the substrate 10. The processing device 41B is configured to grind the planarization layer 15 formed on the second main surface 12 of the substrate 10. The processing device 41C is configured to grind the second main surface 12 of the substrate 10. The processing device 41A may also be referred to as a first main surface grinding device, the processing device 41B may also be referred to as a planarization layer grinding device, and the processing device 41C may also be referred to as a second main surface grinding device. Also, in the first processing block 40, the number of processing devices is not limited to three and may be two or more. Further, in the first processing block 40, the placement of processing devices is not limited to the placement shown in FIG. 1.

The second processing block 43 includes an inverting device 44 and two cleaning devices 45A and 45B. The inverting device 44 is configured to invert the substrate 10. The inverting device 44 may also be referred to as a first inverting device, and the inverting device 39 may also be referred to as a second inverting device. The cleaning device 45A is configured to clean the first main surface 11 of the substrate 10. The cleaning device 45B is configured to clean the second main surface 12 of the substrate 10. The inverting device 44 and the two cleaning devices 45A and 45B are stacked along the Z-axis direction to reduce an installation area of the second processing block 43.

The transfer section 46 is placed next to the processing block 31 of the first processing station 3 and placed in the negative X-axis direction of the processing block 31. Further, the transfer section 46 is placed next to the first processing block 40 of the second processing station 4 and placed in the negative Y-axis direction of the first processing block 40. Furthermore, the transfer section 46 is placed next to the second processing block 43 of the second processing station 4 and placed in the positive X-axis direction of the second processing block 43.

A transfer device 47 is provided inside the transfer section 46. The transfer device 47 includes a holding mechanism configured to hold the substrate 10. The holding mechanism is movable in the horizontal direction (in both the X-axis direction and the Y-axis direction) and the vertical direction, and pivotable around a vertical axis. The transfer device 47 transfers the substrate 10 with respect to the processing block 31 of the first processing station 3, the first processing block 40 of the second processing station 4 and the second processing block 43 of the second processing station 4.

A fan filter unit (FFU) may be provided at a ceiling of the transfer section 36 so that a pressure inside the transfer section 36 of the first processing station is higher than a pressure inside the transfer section 46 of the second processing station 4. The FFU forms a downflow inside the transfer section 36. It is possible to suppress an introduction of airflow from the second processing station 4 into the first processing station 3.

At the boundary between the second processing station 4 and the first processing station 3, a shutter 5 for opening/closing an entrance opening for the substrate 10 may be provided. The shutter 5 is provided, for example, at the boundary between the processing block 31 of the first processing station 3 and the transfer section 46 of the second processing station 4. The shutter 5 opens the entrance opening right before the transfer device 47 enters the processing block 31 from the transfer section 46, and closes the entrance opening right after the transfer device 47 retreats from the processing block 31 to the transfer section 46. Since it is possible to suppress the introduction of airflow from the second processing station 4 to the first processing station 3, it is possible to suppress an introduction of particles generated in the first processing block 40 of the second processing station 4 into the processing block 31 of the first processing station 3 via the transfer section 46.

Likewise, a shutter 6 configured to open/close an entrance opening for the substrate 10 may be provided at the boundary between the transfer section 46 and the second processing block 43 of the second processing station 4. The shutter 6 opens the entrance opening right before the transfer device 47 enters the second processing block 43 from the transfer section 46, and closes the entrance opening right after the transfer device 47 retreats from the second processing block 43 to the transfer section 46. It is possible to suppress an introduction of the particles generated in the first processing block 40 of the second processing station 4 into the second processing block 43 via the transfer section 46.

The control device 9 is implemented by, for example, a computer and includes a central processing unit (CPU) 91 and a recording medium 92 such as a memory. The recording medium 92 stores therein a program for controlling various processings performed by the substrate processing system 1. The control device 9 controls operations of the substrate processing system 1 by causing the CPU 91 to execute the program stored in the recording medium 92. Further, the control device 9 includes an input interface 93 and an output interface 94. The control device 9 receives a signal from the outside through the input interface 93 and transmits a signal to the outside through the output interface 94.

The program may be stored in a computer-readable recording medium and may be installed from the recording medium into the recording medium 92 of the control device 9. Examples of the computer-readable recording medium may include a hard disk (HD), a flexible disk (FD), a compact disk (CD), a magneto optical disc (MO), a memory card, and the like. The program may be downloaded from a server via the Internet and installed in the recording medium 92 of the control device 9.

Figure 3:
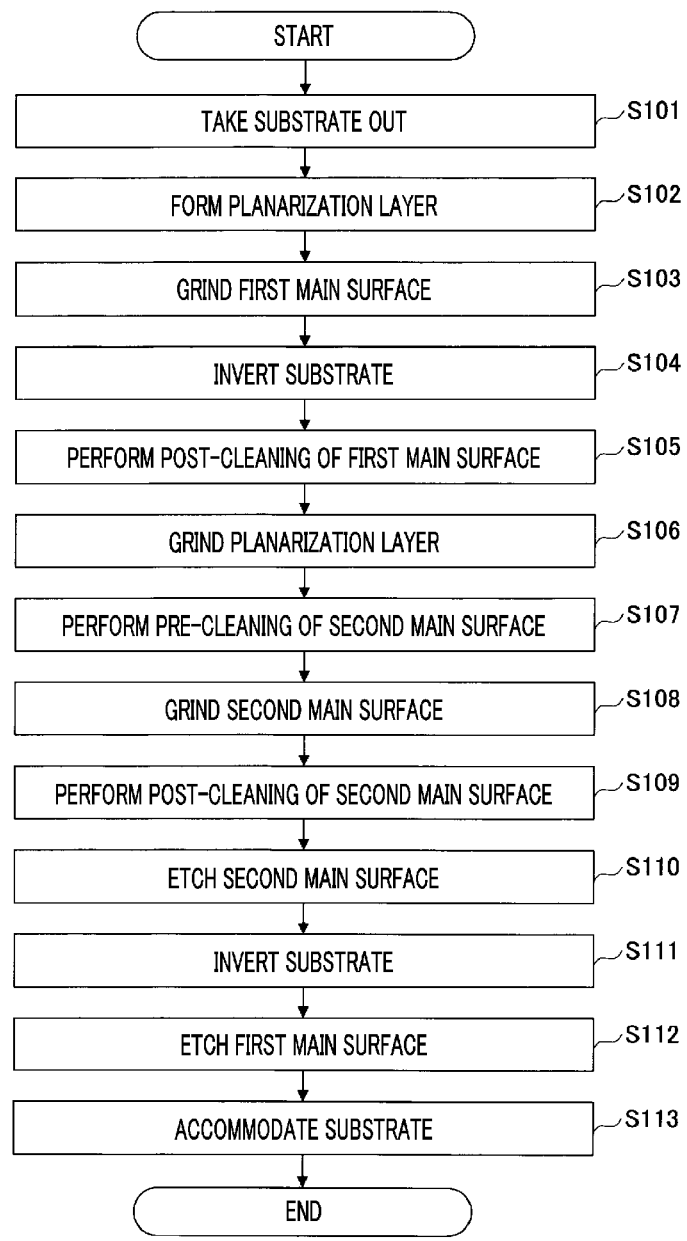
FIG. 3 is a flowchart showing a substrate processing method according to the exemplary embodiment.
Figure 4A:
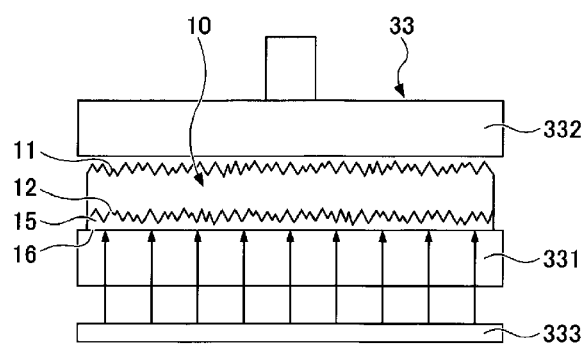
FIGS. 4A to 4C illustrate examples of states of a substrate at the end of forming a planarization layer, at the end of grinding a first main surface, and at the start of inverting the substrate, respectively.
Figure 4B:
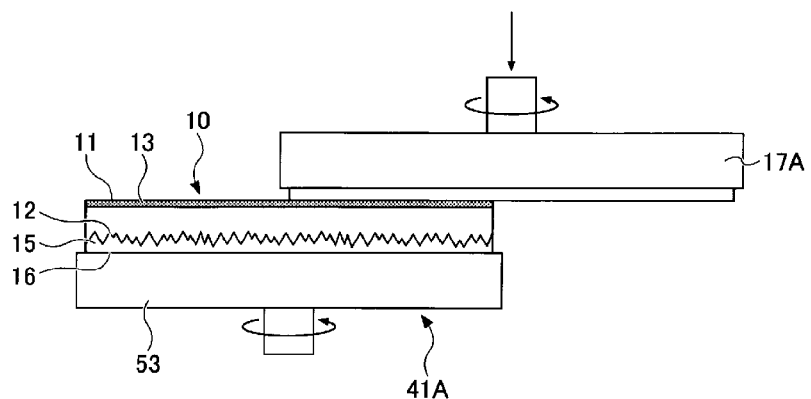
Figure 4C:
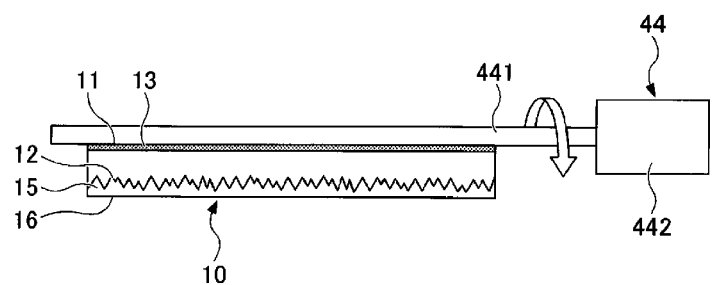
Figure 5A:
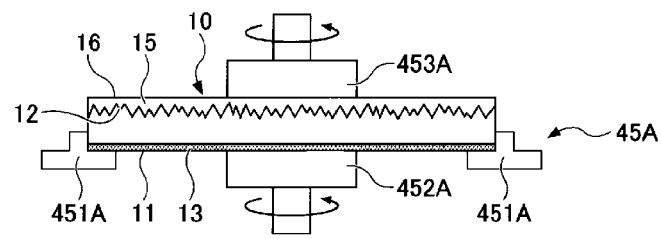
FIGS. 5A to 5C illustrate examples of states of the substrate at the end of post-cleaning the first main surface, at the start of grinding the planarization layer, and at the end of pre-cleaning a second main surface, respectively.
Figure 5B:
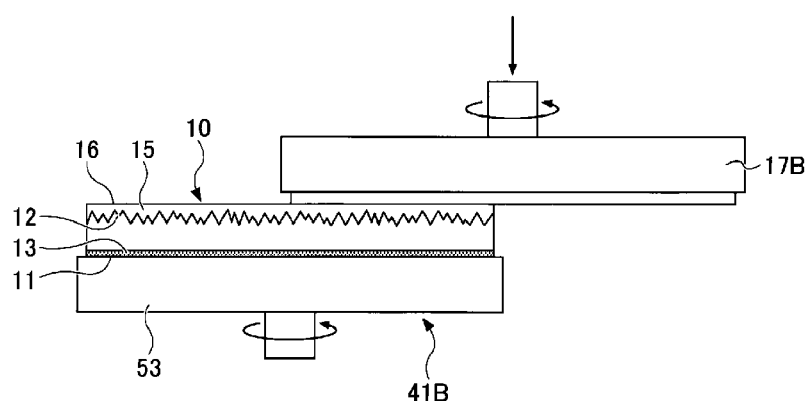
Figure 5C:
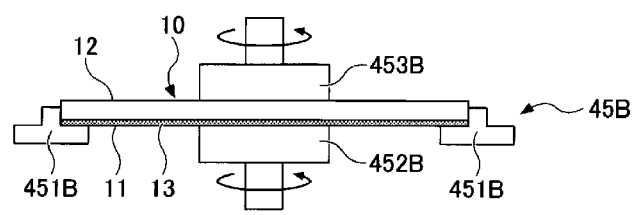
Figure 6A:
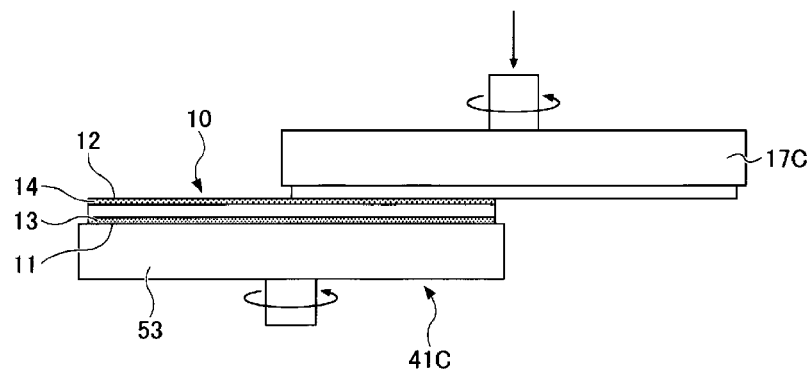
FIGS. 6A to 6C illustrate examples of states of the substrate at the end of grinding the second main surface, at the end of post-cleaning the second main surface, and at the start of etching the second main surface, respectively.
Figure 6B:
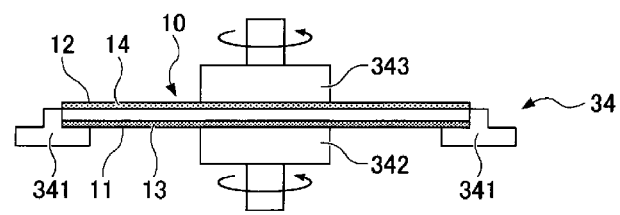
Figure 6C:
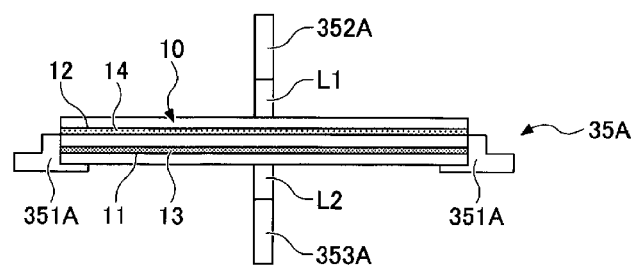
Figure 7A:
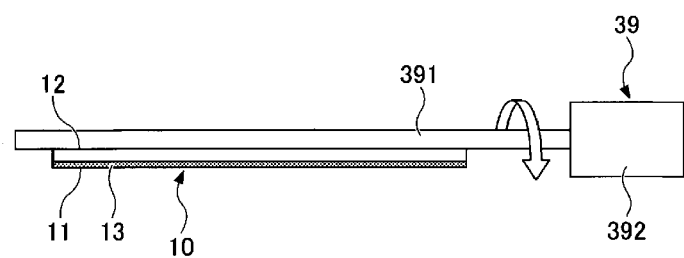
FIGS. 7A to 7C illustrate examples of states of the substrate at the start of inverting the substrate, at the start of etching the first main surface, and at the time of being carried into a carrier, respectively.
Figure 7B:
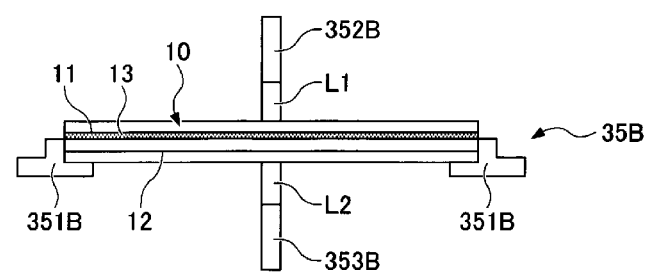
Figure 7C:
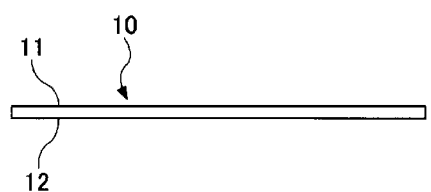

FIG. 3 is a flowchart showing a substrate processing method according to the exemplary embodiment. FIGS. 4A to 4C illustrate examples of states of a substrate at the end of forming a planarization layer, at the end of grinding a first main surface, and at the start of inverting the substrate, respectively. Specifically, FIG. 4A illustrates an example of the state of the substrate at the end of forming a planarization layer, FIG. 4B illustrates an example of the state of the substrate at the end of grinding a first main surface, and FIG. 4C illustrates an example of the state of the substrate at the start of inverting the substrate. FIGS. 5A to 5C illustrate examples of the states of the substrate at the end of post-cleaning the first main surface, at the start of grinding the planarization layer, and at the end of pre-cleaning a second main surface, respectively. Specifically, FIG. 5A illustrates an example of the state of the substrate at the end of post-cleaning the first main surface, FIG. 5B illustrates an example of the state of the substrate at the start of grinding the planarization layer, and FIG. 5C illustrates an example of the state of the substrate at the end of pre-cleaning a second main surface. FIGS. 6A to 6C illustrate examples of the states of the substrate at the end of grinding the second main surface, at the end of post-cleaning the second main surface, and at the start of etching the second main surface, respectively. Specifically, FIG. 6A illustrates an example of the state of a substrate at the end of grinding the second main surface, FIG. 6B illustrates an example of the state of the substrate at the end of post-cleaning the second main surface, and FIG. 6C illustrates an example of the state of the substrate at the start of etching the second main surface. FIGS. 7A to 7C illustrate examples of the states of the substrate at the start of inverting the substrate, at the start of etching the first main surface, and at the time of being carried into a carrier, respectively. Specifically, FIG. 7A illustrates an example of the state of the substrate at the start of inverting the substrate, FIG. 7B illustrates an example of the state of the substrate at the start of etching the first main surface, and FIG. 7C illustrates an example of the state of the substrate at the time of being carried into the carrier. The processings shown in FIG. 3 to FIGS. 7A to 7C are performed under the control of the control device 9.

The substrate processing method includes a process S101 of taking the substrate 10 out of the carrier C placed in in the carrier placing section 21. The transfer device 27 takes the substrate 10 out of the carrier C. The carrier C accommodates the substrate 10 whose first main surface 11 faces upwards. The substrate 10 is transferred by the transfer device 27 from the carrier placing section 21 to the first transition device 29 and then transferred by the transfer device 37 from the first transition device 29 to the planarizing device 33.

The substrate processing method includes a process S102 of forming the planarization layer 15 on the second main surface 12 of the substrate 10 by the planarizing device 33. The planarizing device 33 includes, for example, a table 331 and a pressing plate 332 as shown in FIG. 4A. The table 331 supports the substrate 10 from below with the first main surface 11 of the substrate 10 facing upwards. The pressing plate 332 is movable in the vertical direction and presses the substrate 10 from above to pressurize a liquid planarizing agent placed between the substrate 10 and the table 331. The planarizing agent is pressed against a flat upper surface of the table 331. Thereafter, the planarization layer 15 is formed by solidifying the planarizing agent.

The planarizing agent is for example, but not particularly limited to, an ultraviolet curing resin. In this case, the planarizing device 33 has a light source 333 configured to radiate ultraviolet ray to the ultraviolet curing resin. The table 331 may transmit the ultraviolet ray, and the light source 333 may radiate the ultraviolet ray to the ultraviolet curing resin via the table 331. Alternatively, the planarizing agent may be a thermoplastic resin or the like.

The substrate 10 on which the planarization layer 15 is formed is transferred by the transfer device 37 from the planarizing device 33 to the second transition device 32, and then, transferred by the transfer device 47 from the second transition device 32 to the processing device 41A.

Further, the substrate processing system 1 may not include the planarizing device 33, and the substrate processing method may not include the process S102 of forming the planarization layer 15. In this case, the planarization layer 15 is formed outside the substrate processing system 1 and then, the substrate 10 is accommodated in the carrier C and thereafter, the carrier C is carried into the substrate processing system 1. In some cases, it may not be necessary to form the planarization layer 15 on the second main surface 12 of the substrate 10.

The substrate processing method includes a process S103 of grinding the first main surface 11 of the substrate 10 by the processing device 41A. The processing device 41A has a chuck table 53 as shown in FIG. 4B. The chuck table 53 holds a flat surface 16 of the planarization layer 15 from below with the first main surface 11 of the substrate 10 facing upwards. The processing device 41A rotates the substrate 10 together with the chuck table 53 and lowers a grinding tool 17A placed above the chuck table 53 while rotating the grinding tool 17A to grind the first main surface 11 of the substrate 10. The first main surface 11 of the substrate 10 can be ground while being in parallel with the flat surface 16 of the planarization layer 15. Therefore, the flatness of the first main surface 11 after grinding can be improved. At the end of the grinding, a damage layer 13 is formed on the first main surface 11 of the substrate 10 by being in contact with the grinding tool 17A. Thereafter, the substrate 10 is transferred by the transfer device 47 from the processing device 41A to the inverting device 44. In the present exemplary embodiment, the processing device 41A holds the flat surface 16 of the planarization layer 15 from below with the first main surface 11 of the substrate 10 facing upwards and grinds the first main surface 11, but the present disclosure is not limited thereto. Even if the planarization layer 15 is not formed on the second main surface 12, the first main surface 11 can be ground flat in some cases.

The substrate processing method includes a process S104 of inverting the substrate 10 by the inverting device 44. As shown in FIG. 4C, the inverting device 44 has a holding mechanism 441 configured to hold the substrate 10 and a rotating mechanism 442 configured to rotate the holding mechanism 441. The rotating mechanism 442 rotates the holding mechanism 441 by 180° to invert the substrate 10. The substrate 10 is changed from a state in which the first main surface 11 faces upwards to a state in which the first main surface 11 faces downwards. The inverted substrate 10 is transferred by the transfer device 47 from the inverting device 44 to the cleaning device 45A.

The substrate processing method includes a process S105 of cleaning the substrate 10 by the cleaning device 45A. As shown in FIG. 5A, the cleaning device 45A has a chuck 451A, a lower surface brush 452A and an upper surface brush 453A. The chuck 451A holds an outer peripheral portion of the substrate 10 with the second main surface 12 of the substrate 10 facing upwards. The lower surface brush 452A scrubs the first main surface 11 of the substrate 10. Meanwhile, the upper surface brush 453A scrubs the flat surface 16 of the planarization layer 15. The scrubbing is rubbing by bringing solid into contact with the substrate 10. If the planarization layer 15 has not been formed on the second main surface 12, the upper surface brush 453A scrubs the second main surface 12.

In the present exemplary embodiment, disk brushes may be used as the lower surface brush 452A and the upper surface brush 453A, or roll brushes may be used. Further, sponges may be used instead of the brushes. In either case, ground scraps adhering to the first main surface 11 of the substrate 10 can be removed. The cleaned substrate 10 is transferred by the transfer device 47 from the cleaning device 45A to the processing device 41B.

The order of the process S104 of inverting the substrate 10 and the process S105 of cleaning the substrate 10 may be reversed. That is, after the process S105 of cleaning the substrate 10, the process S104 of inverting the substrate 10 may be performed. The substrate 10 is inverted by the inverting device 44 and cleaned by the cleaning device 45A, and then, transferred by the transfer device 47 to the processing device 41B.

The substrate processing method includes a process S106 of grinding the planarization layer 15 by the processing device 41B. The processing device 41B has a chuck table 53 as shown in FIG. 5B. The chuck table 53 holds the ground first main surface 11 of the substrate 10 from below with the second main surface 12 of the substrate 10 facing upwards. The processing device 41B rotates the substrate 10 together with the chuck table 53 and lowers a grinding tool 17B placed above the chuck table 53 while rotating the grinding tool 17B to grind the planarization layer 15. Thereafter, the substrate 10 is transferred by the transfer device 47 from the processing device 41B to the cleaning device 45B. If the planarization layer 15 is not formed on the second main surface 12, the process S106 of grinding the planarization layer 15 is not necessary.

The substrate processing method includes a process S107 of cleaning the substrate 10 by the cleaning device 45B. As shown in FIG. 5C, the cleaning device 45B includes a chuck 451B, a lower surface brush 452B and an upper surface brush 453B. The chuck 451B holds the outer peripheral portion of the substrate 10 with the second main surface 12 of the substrate 10 facing upwards. The lower surface brush 452B scrubs the first main surface 11 of the substrate 10. Meanwhile, the upper surface brush 453B scrubs the second main surface 12 of the substrate 10.

In the present exemplary embodiment, disk brushes are used as the lower surface brush 452B and the upper surface brush 453B, but roll brushes may be used. Further, sponges may be used instead of the brushes. In either case, ground scraps adhering to the second main surface 12 of the substrate 10 can be removed. The cleaned substrate 10 is transferred by the transfer device 47 from the cleaning device 45B to the processing device 41C.

The substrate processing method includes a process S108 of grinding the second main surface 12 of the substrate 10 by the processing device 41C. The processing device 41C has a chuck table 53 as shown in FIG. 6A. The chuck table 53 holds the ground first main surface 11 of the substrate 10 from below with the second main surface 12 of the substrate 10 facing upwards. The processing device 41C rotates the substrate 10 together with the chuck table 53, and lowers a grinding tool 17C placed above the chuck table 53 while rotating the grinding tool 17C to grind the second main surface 12 of the substrate 10. The first main surface 11 has been planarized in advance by the grinding (process S103), and the second main surface 12 is ground while being in parallel with the first main surface 11. Therefore, the flatness of the second main surface 12 after grinding can be improved. At the end of the grinding, a damage layer 14 is formed on the second main surface 12 of the substrate 10 by being contact with the grinding tool 17C. Thereafter, the substrate 10 is transferred by the transfer device 47 from the processing device 41C to the cleaning device 34.

The substrate processing method includes a process S109 of cleaning the substrate 10 by the cleaning device 34. As shown in FIG. 6B, the cleaning device 34 has a chuck 341, a lower surface brush 342 and an upper surface brush 343. The chuck 341 holds the outer peripheral portion of the substrate 10 with the second main surface 12 of the substrate 10 facing upwards. The lower surface brush 342 scrubs the first main surface 11 of the substrate 10. Meanwhile, the upper surface brush 343 scrubs the second main surface 12 of the substrate 10.

In the present exemplary embodiment, disk brushes are used as the lower surface brush 342 and the upper surface brush 343, but roll brushes may be used. Further, sponges may be used instead of the brushes. In either case, ground scraps adhering to the second main surface 12 of the substrate 10 can be removed. The cleaned substrate 10 is transferred by the transfer device 37 from the cleaning device 34 to the etching device 35A.

The substrate processing method includes a process S110 of etching the substrate 10 by the etching device 35A. As shown in FIG. 6C, the etching device 35A has a chuck 351A, an upper surface nozzle 352A and a lower surface nozzle 353A. The chuck 351A holds the outer peripheral portion of the substrate 10 with the ground second main surface 12 of the substrate 10 facing upwards.

The upper surface nozzle 352A is configured to supply the second main surface 12 of the substrate 10 with an etchant L1 configured to remove the damaged layer 14. The etchant L1 is, for example, an acidic or alkaline chemical solution. The etchant L1 spreads over the entire second main surface 12 of the substrate 10 due to the centrifugal force of the substrate 10 rotating together with the chuck 351A.

Meanwhile, the lower surface nozzle 353A is configured to supply the first main surface 11 of the substrate 10 with a guard liquid L2 configured to suppress an introduction of the etchant L1. The guard liquid L2 is, for example, deionized water (DIW) or the like. The guard liquid L2 spreads over the entire first main surface 11 of the substrate 10 due to the centrifugal force of the substrate 10 rotating together with the chuck 351A. The substrate 10 from which the damaged layer 14 has been removed is dried and then transferred by the transfer device 37 from the etching device 35A to the inverting device 39.

The substrate processing method includes a process S111 of inverting the substrate 10 by the inverting device 39. As shown in FIG. 7A, the inverting device 39 has a holding mechanism 391 configured to hold the substrate 10 and a rotating mechanism 392 configured to rotate the holding mechanism 391. The rotating mechanism 392 rotates the holding mechanism 391 by 180° to invert the substrate 10. The substrate 10 is changed from a state in which the second main surface 12 faces upwards to a state in which the second main surface 11 faces downwards. The inverted substrate 10 is transferred by the transfer device 37 from the inverting device 39 to the etching device 35B.

The substrate processing method includes a process S112 of etching the substrate 10 by the etching device 35B. As shown in FIG. 7B, the etching device 35B has a chuck 351B, an upper surface nozzle 352B and a lower surface nozzle 353B. The chuck 351B holds the outer peripheral portion of the substrate 10 with the ground first main surface 11 of the substrate 10 facing upwards.

The upper surface nozzle 352B is configured to supply the first main surface 11 of the substrate 10 with the etchant L1 configured to remove the damaged layer 13. The etchant L1 is, for example, an acidic or alkaline chemical solution. The etchant L1 spreads over the entire first main surface 11 of the substrate 10 due to the centrifugal force of the substrate 10 rotating together with the chuck 351B.

Meanwhile, the lower surface nozzle 353B is configured to supply the second main surface 12 of the substrate 10 with the guard liquid L2 configured to suppress an introduction of the etchant L1. The guard liquid L2 is, for example, deionized water (DIW) or the like. The guard liquid L2 spreads over the entire second main surface 12 of the substrate 10 due to the centrifugal force of the substrate 10 rotating together with the chuck 351B. The substrate 10 from which the damaged layer 13 has been removed is dried and then transferred by the transfer device 37 from the etching device 35B to the first transition device 29 and also transferred by the transfer device 27 from the first transition device 29 to the carrier placing section 21.

The substrate processing method includes a process S113 of accommodating the substrate 10 on which the first main surface 11 has been ground and etched and the second main surface 12 has been ground and etched and which has been dried (see FIG. 7C) in the carrier C placed in the carrier placing section 21. The substrate 10 is accommodated in the carrier C by the transfer device 27.

The substrate processing method includes the grinding of the first main surface 11 (process S103), the inverting of the substrate 10 (process S104) and the grinding of the second main surface 12 (process S108) from the taking of the substrate 10 out of the carrier C (process S101) to the accommodating of the substrate 10 (process S113). The both surfaces of the substrate 10 can be systematically ground flat by using the substrate processing system 1.

By the way, the substrate processing system 1 according to the present exemplary embodiment includes the three processing devices 41A, 41B and 41C. The processing device 41A corresponds to a first main surface grinding device described in the claims, the processing device 41B corresponds to a planarization layer grinding device described in the claims, and the processing device 41C corresponds to a second main surface grinding device described in the claims.

The substrate processing method according to the present exemplary embodiment includes a process S106 of grinding the planarization layer 15 by the grinding tool 17B different from the grinding tool 17C for grinding the second main surface 12 of the substrate 10. If the planarization layer 15 and the substrate 10 are greatly different from each other in material and there is no grinding tool capable of grinding both the planarization layer 15 and the substrate 10, the planarization layer 15 and the substrate 10 can be ground separately.

The three processing devices 41A, 41B and 41C have the same configuration. Therefore, the configuration of the processing device 41A will be described below with reference to FIG. 8 and FIGS. 9A and 9B and the description of the configuration of the other two processing devices 41B and 41C will be omitted.

Figure 8:
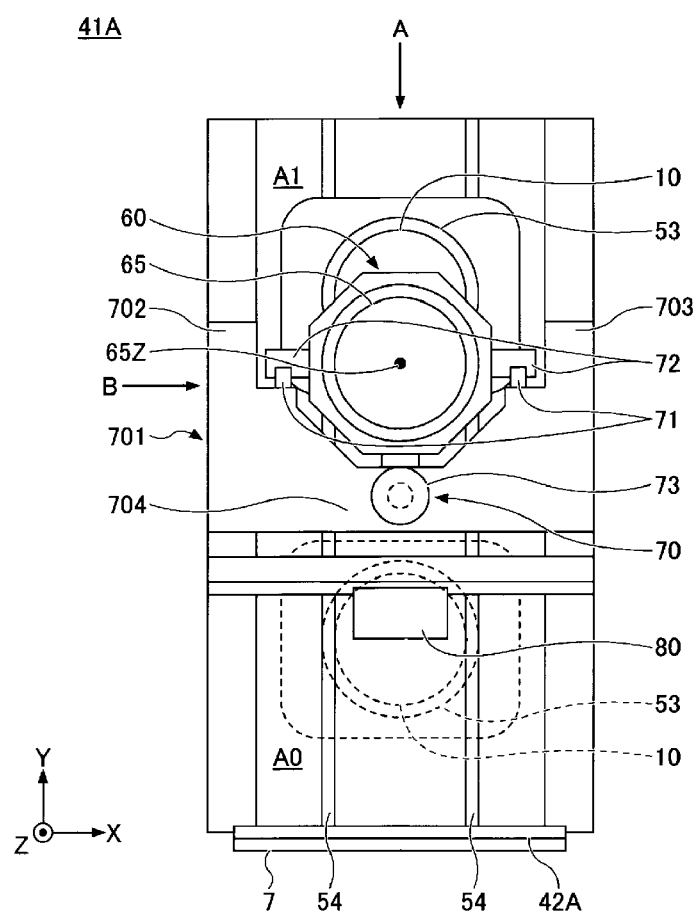
FIG. 8 is a top view illustrating a processing device according to the exemplary embodiment.
Figure 9:
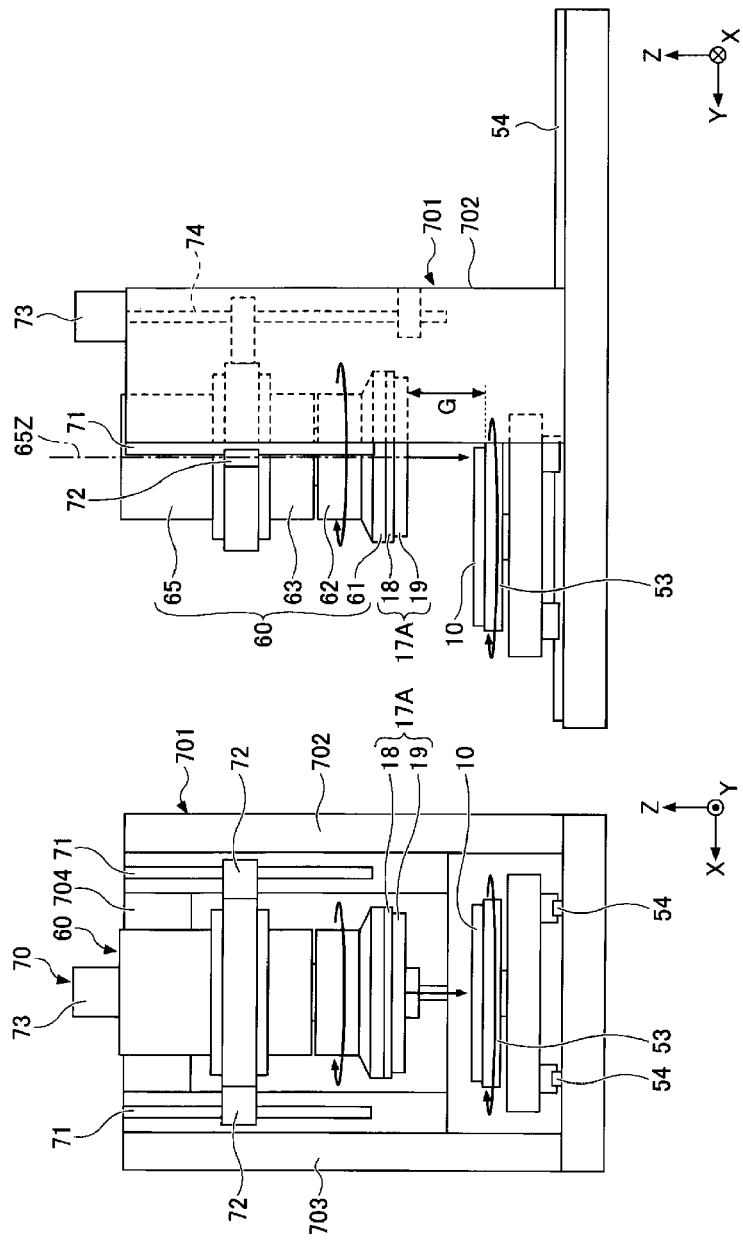
FIGS. 9A and 9B illustrate examples of the positional relationship between a driving unit and an elevating unit when viewed from the direction indicated by arrow A and arrow B in FIG. 8.

FIG. 8 is a top view illustrating a processing device according to the exemplary embodiment. FIGS. 9A and 9B illustrate examples of the positional relationship between a driving unit and an elevating unit when viewed from the direction indicated by arrow A and arrow B in FIG. 8. Specifically, FIG. 9A illustrates an example of the positional relationship between the driving unit and the elevating unit when viewed from the direction indicated by arrow A in FIG. 8, and FIG. 9B illustrates an example of the positional relationship between the driving unit and the elevating unit when viewed from the direction indicated by arrow B in FIG. 8.

The processing device 41A has a chuck table 53, a driving unit 60, an elevating unit 70 and a cleaning unit 80. The chuck table 53 has a substrate holding surface configured to horizontally hold the substrate 10 from below. The substrate holding surface has a larger diameter than the substrate 10 and attracts the entire lower surface of the substrate 10.

The driving unit 60 is equipped with the grinding tool 17A for grinding the substrate 10 in a replaceable manner. The grinding tool 17A includes, for example, a disk-shaped wheel 18 and a plurality of grindstones 19 arranged in a ring shape. The plurality of grindstones 19 is fixed to, for example, an outer peripheral portion of a lower surface of the wheel 18. When the grindstones 19 are worn out and the thickness of the grindstones 19 becomes smaller than a predetermined thickness for replacement, the grinding tool 17A is replaced. The replacement of the grinding tool 17A may be performed periodically. The grindstones 19 may be fixed in a disk shape to the entire lower surface of the wheel 18.

The driving unit 60 includes, for example, a flange 61 equipped with the grinding tool 17A in the replaceable manner, a spindle shaft 62 provided with the flange 61 at a lower end portion thereof, a bearing 63 configured to rotatably support the spindle shaft 62 and a spindle motor 65 configured to rotate the spindle shaft 62.

The spindle motor 65 rotates the grinding tool 17A provided at the flange 61 by rotating the spindle shaft 62. The spindle motor 65 has a rotor to which the spindle shaft 62 is connected, a stator that forms a rotating magnetic field therein and a housing to which the stator is fixed. The housing is fixed to a pair of Z-axis sliders 72 of the elevating unit 70.

As the spindle motor 65, for example, an induction motor is used to obtain a high torque. The induction motor forms a rotating magnetic field by supplying an alternating current to windings of the stator and rotates the rotor by the rotating magnetic field. The grinding tool 17A is rotated at the rotation number depending on the frequency of the alternating current supplied to the windings of the stator.

The elevating unit 70 is configure to elevate the driving unit 60 in the vertical direction to move the grinding tool 17A provided at the driving unit 60 toward and away from the chuck table 53. The elevating unit 70 includes a pair of Z-axis guides 71 extending in the Z-axis direction, a pair of Z-axis sliders 72 configured to move up and down along the pair of Z-axis guides 71 and a Z-axis motor 73 configured to elevate the pair of Z-axis sliders 72. The Z-axis guides 71 may also be referred to as elevating guides, and the Z-axis sliders 72 may also be referred to as elevating sliders. The driving unit 60 is fixed to the pair of Z-axis sliders 72. The Z-axis motor 73 may perform a rotational movement or perform a linear movement. The elevating unit 70 has a ball screw 74 configured to convert the rotational movement of the Z-axis motor 73 into a linear movement of the pair of Z-axis sliders 72 when the Z-axis motor 73 performs the rotational movement.

The elevating unit 70 lowers the driving unit 60 to move the driving unit 60 toward the chuck table 53. In the meantime, the grinding tool 17A provided at the driving unit 60 is rotated. The grinding tool 17A is lowered while being rotated to be brought into contact with the substrate 10 rotating together with the chuck table 53, and grinds the substrate 10. Thereafter, the elevating unit 70 raises the driving unit 60 to move the driving unit 60 away from the chuck table 53.

As shown in FIG. 8, the processing device 41A has a rectangular outer shape when viewed from above, and has two sides parallel with a forward and backward direction (for example, the Y-axis direction). The processing device 41A has a Y-axis guide 54. The Y-axis guide 54 is a horizontal guide that guides the chuck table 53 in the forward and backward direction. A delivery position A0 and a processing position A1 are placed along the Y-axis guide 54. The chuck table 53 linearly moves in the Y-axis direction between the delivery position A0 and the processing position A1. Since the chuck table 53 does not move in the X-axis direction, the processing device 41A is provided narrow and long in the Y-axis direction, which makes it possible to reduce the processing device 41A in size.

The delivery position A0 is a position where the substrate 10 is delivered to the chuck table 53. The delivery position A0 serves as a position where the substrate 10 is delivered from the transfer device 47 to the chuck table 53 and a position where the substrate 10 is delivered from the chuck table 53 to the transfer device 47.

The processing position A1 is a position where the substrate 10 held on the chuck table 53 is processed by the grinding tool 17A. At the processing position A1, the grinding tool 17A provided at the driving unit 60 processes the upper surface of the substrate 10. Here, the upper surface of the substrate 10 is, for example, the first main surface 11 of the substrate 10.

The delivery position A0 may also serve as a position where the substrate 10 is cleaned by the cleaning unit 80. The cleaning unit 80 cleans the upper surface of the substrate 10 before the substrate 10 processed at the processing position A1 is separated from the chuck table 53. The cleaning is performed by, for example, spray cleaning. In this case, the processing of the substrate 10 and the cleaning of the processed substrate 10 are performed sequentially.

The delivery position A0 may also serve as a position where the cleaning unit 80 cleans the substrate holding surface of the chuck table 53. After the substrate 10 processed at the processing position A1 is separated from the chuck table 53, the cleaning unit 80 cleans the exposed substrate holding surface. The cleaning may be performed by any one or both of, for example, spray cleaning or scrubbing. In this case, the processing of the substrate 10 and the cleaning of the exposed substrate holding surface are performed sequentially.

As shown in FIG. 8, when viewed from above, the delivery position A0 is located in front of the processing position A1 (in the negative Y-axis direction) and placed near a carry-in/out port 42A through which the substrate 10 of the processing device 41A is carried in and out. Since the transfer device 47 carries the substrate 10 into and out of the processing device 41A from the front of the processing device 41A, the transfer device 47 can easily access the delivery position A0. Therefore, the delivery of the substrate 10 can be performed smoothly.

The carry-in/out port 42A is an opening formed at a wall of the processing device 41A facing the transfer section 46, i.e., a front surface of the processing device 41A. The wall of the processing device 41A facing the transfer section 46 is perpendicular to the Y-axis direction. The shutter 7 configured to open/close the carry-in/out port 42A may be provided at the carry-in/out port 42A. The shutter 7 opens the carry-in/out port 42A right before the transfer device 47 enters the processing device 41A from the transfer section 46, and closes the carry-in/out port 42A right after the transfer device 47 retreats from the processing device 41A to the transfer section 46. When the substrate 10 passes through the carry-in/out port 42A, the shutter 7 opens the carry-in/out port 42A. Meanwhile, when the processing device 41A processes the substrate 10, the shutter 7 closes the carry-in/out port 42A. Thus, it is possible to suppress an introduction of processing scraps generated within the processing device 41A into the transfer section 46.

As shown in FIG. 8, when viewed from above, a part of the chuck table 53 located at the processing position A1 is placed behind the grinding tool 17A provided at the driving unit 60 (for example, in the positive Y-axis direction). When the grinding tool 17A is replaced, a gap G between the grinding tool 17A and the chuck table 53 (see FIG. 9B) can be seen from behind the processing device 41A. Therefore, the gap G can be adjusted easily and the maintainability is good.

The elevating unit 70 has a portal frame 701 that straddles a movement path of the chuck table 53. The portal frame 701 has a pair of columns 702 and 703 placed at an interval in the X-axis direction and a horizontal beam 704 connecting upper ends of the pair of columns 702 and 703. The pair of Z-axis guides 71 are fixed to the pair of columns 702 and 703, respectively, and the Z-axis motor 73 is fixed to the horizontal beam 704.

The elevating unit 70 has the pair of Z-axis guides 71 fixed to the portal frame 701 and the pair of Z-axis sliders 72 that move up and down along the pair of Z-axis guides 71. The driving unit 60 is fixed to the pair of Z-axis sliders 72.

As shown in FIG. 8, the pair of Z-axis sliders 72 are placed symmetrically with respect to a rotational axis 65Z of the spindle motor 65. As a result, as shown in FIG. 9B, a load of the spindle motor 65 and the like can be supported near the rotational axis 65Z of the spindle motor 65. Therefore, it is possible to suppress bending deformation of the pair of Z-axis guides 71, and, thus, it is possible to suppress tilting of the grinding tool 17A to the chuck table 53.

As shown in FIG. 9A, when viewed from directly behind the processing device 41A, the elevating unit 70 may be placed on both lateral sides of the driving unit 60 (in the positive and negative X-axis directions) and on the front side of the driving unit 60 (in the negative Y-axis direction). When viewed from directly behind the processing device 41A, the entire grinding tool 17A provided at the driving unit 60 is exposed from the elevating unit 70. That is, when viewed from directly behind the processing device 41A, the elevating unit 70 does not hide the grinding tool 17A provided at the driving unit 60. Accordingly, the grinding tool 17A can be replaced from behind the processing device 41A without being hindered off by the elevating unit 70. Therefore, the grinding tool 17A can be replaced easily and the maintainability is good.

Since the grinding tool 17A can be replaced from behind the rectangular processing device 41A when viewed from above, the processing device 41A may be hindered in the other three directions (forward, left, and right directions) by another device or a wall of a building or the like. In any of the other three directions of the processing device 41A, it is unnecessary for an operator to have a work space for replacing the grinding tool 17A. Therefore, the installation area of the substrate processing system 1 can be reduced, which makes it possible to reduce the substrate processing system 1 in size. Also, the grinding tool 17A may be replaced by a robot instead of the operator.

Since the grinding tool 17A can be replaced from behind the rectangular processing device 41A when viewed from above, the plurality of processing devices 41A, 41B and 41C may be arranged and placed in the horizontal direction (for example, in the X-axis direction) when viewed from behind. The plurality of processing devices 41A, 41B and 41C can simultaneously process different substrates 10, and, thus, the number of substrates 10 to be processed per unit time can be increased.

Figure 10:
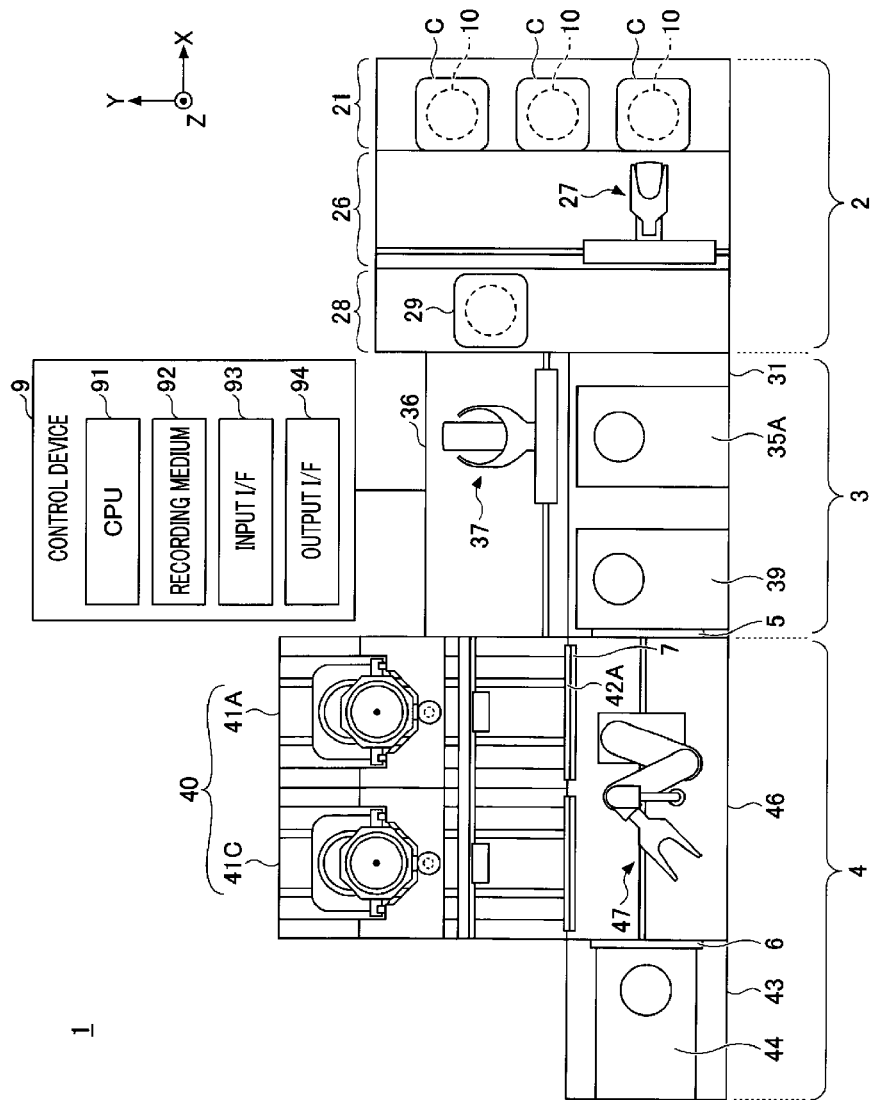
FIG. 10 is a top view illustrating a first modification example of the substrate processing system.
Figure 11:
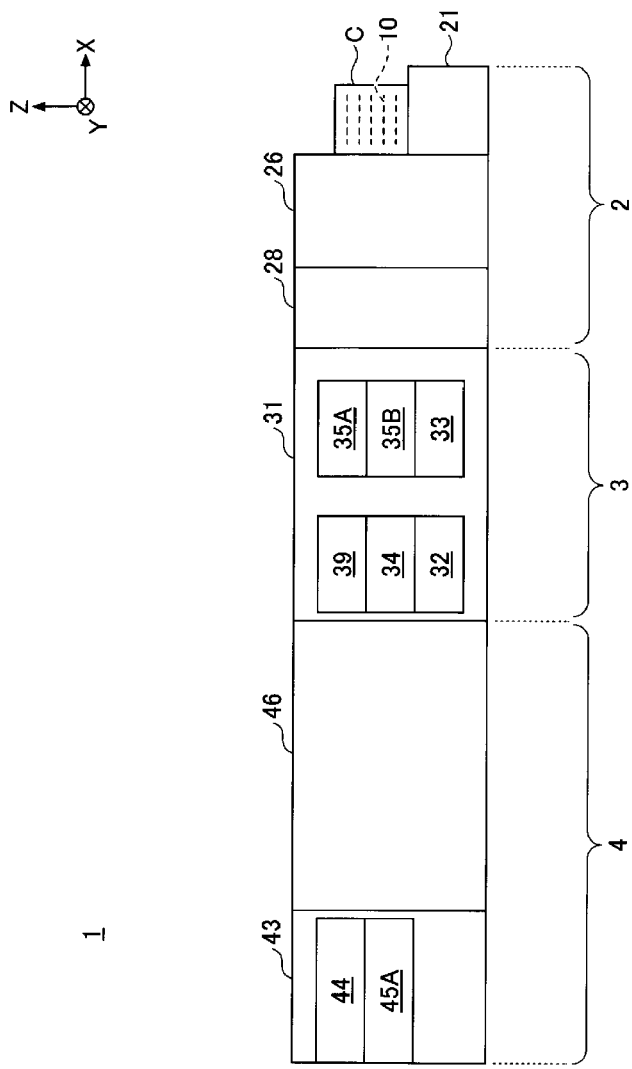
FIG. 11 is a front view illustrating the first modification example of the substrate processing system.
Figure 12:
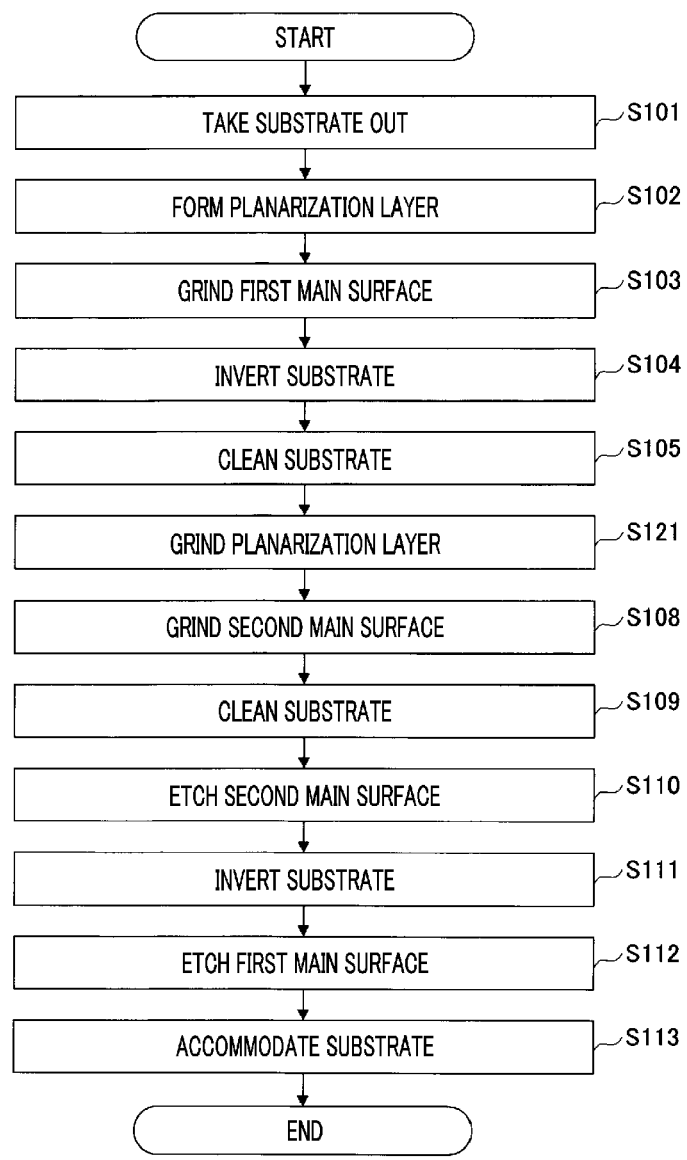
FIG. 12 is a flowchart showing a first modification example of the substrate processing method.

FIG. 10 is a top view illustrating a first modification example of the substrate processing system. FIG. 11 is a front view illustrating the first modification example of the substrate processing system. FIG. 12 is a flowchart showing a first modification example of the substrate processing method. Hereinafter, differences between the above-described exemplary embodiment and the present modification example will be mainly described.

The substrate processing system 1 according to the present modification example includes two processing devices 41A and 41C. The processing device 41C has the driving unit 60 (see FIG. 8 and FIGS. 9A and 9B) on which the grinding tool 17C for grinding both the planarization layer 15 and the second main surface 12 of the substrate 10 is provided in the replaceable manner, and the elevating unit 70 (see FIG. 8 and FIGS. 9A and 9B) configured to elevate the driving unit 60.

The substrate processing method according to the present modification example includes a process S121 of grinding the planarization layer 15 by the grinding tool 17C for grinding the second main surface 12 of the substrate 10. The processing device 41C can continuously perform the grinding of the planarization layer 15 (process S121) and the grinding of the second main surface 12 of the substrate 10 (process S108), and, thus, the processing device 41B is not necessary. Therefore, the installation area of the substrate processing system 1 can be reduced. Further, between the grinding of the planarization layer 15 (process S121) and the grinding of the second main surface 12 of the substrate 10 (process S108), the cleaning of the substrate 10 (process S107 (see FIG. 3)) is not necessary, and, thus, the cleaning device 45B is not necessary. If the planarization layer 15 is not formed on the second main surface 12, the process S121 of grinding the planarization layer 15 is not necessary, and the processing device 41C grinds the second main surface 12 without grinding the planarization layer 15.

Figure 13:
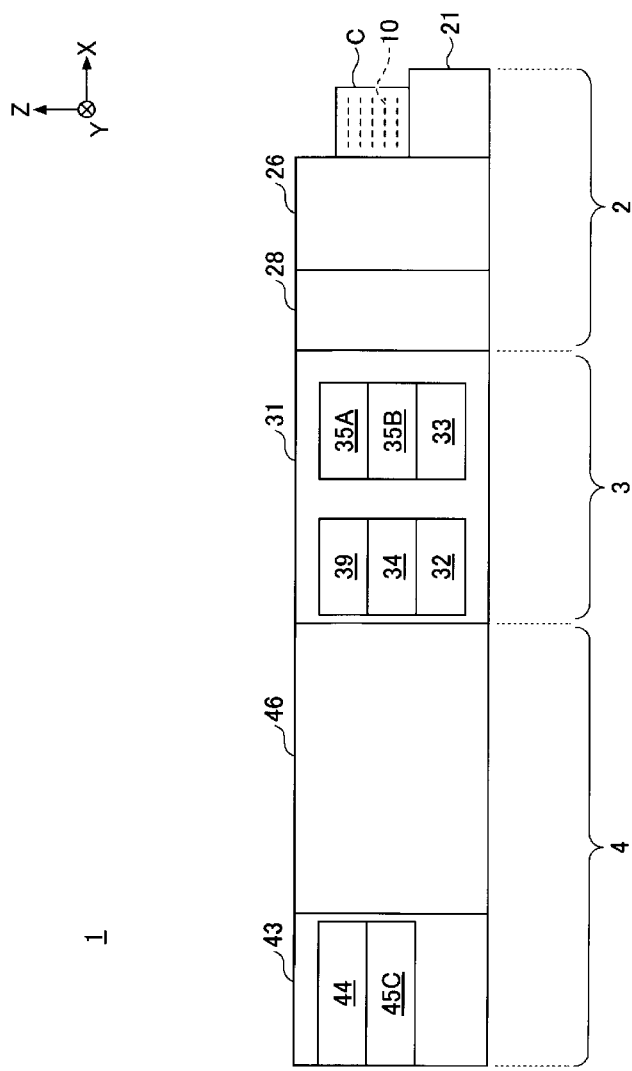
FIG. 13 is a front view illustrating a second modification example of the substrate processing system.
Figure 14:
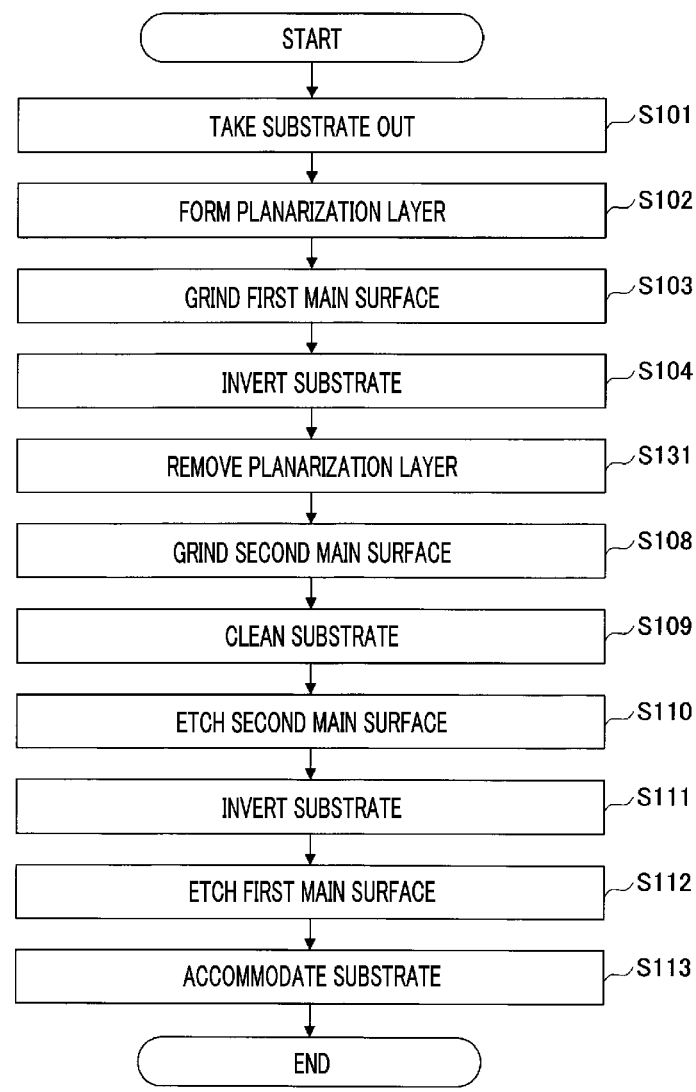
FIG. 14 is a flowchart showing a second modification example of the substrate processing method.
Figure 15:
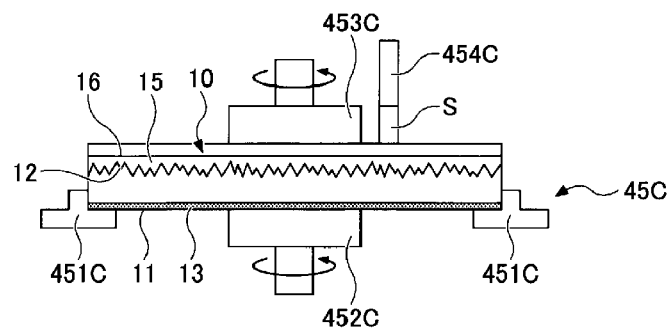
FIG. 15 illustrates an example of a state of the substrate at the start of removing the planarization layer.

FIG. 13 is a front view illustrating a second modification example of the substrate processing system. The top view of the substrate processing system 1 according to the present modification example is the same as the top view (FIG. 10) of the substrate processing system 1 according to the above-described first modification example. Therefore, illustration thereof will be omitted. FIG. 14 is a flowchart showing a second modification example of the substrate processing method. FIG. 15 illustrates an example of the state of the substrate at the start of removing the planarization layer.

Hereinafter, differences between the above-described exemplary embodiment and the present modification example will be mainly described.

The substrate processing system 1 of the present modification example includes two processing devices 41A and 41C similarly to the substrate processing system 1 of the first modification example. The processing device 41C of the present modification example, unlike the processing device 41C of the first modification example, grinds the second main surface 12 of the substrate 10 without grinding the planarization layer 15.

The substrate processing system 1 of the present modification example includes a cleaning device 45C configured to dissolve and remove the planarization layer 15 with a solvent S to omit the grinding of the planarization layer 15. As shown in FIG. 15, the cleaning device 45C has a chuck 451C, a lower surface brush 452C, an upper surface brush 453C and a solvent discharge nozzle 454C. The chuck 451C holds the outer peripheral portion of the substrate 10 with the second main surface 12 of the substrate 10 facing upwards.

Since the lower surface brush 452C scrubs the first main surface 11 of the substrate 10, the cleaning device 45C also serves as the cleaning device 45A shown in FIG. 5A or the like. Meanwhile, the upper surface brush 453C scrubs the flat surface 16 of the planarization layer 15. The solvent discharge nozzle 454C discharges the solvent S from above the substrate 10. The solvent S is, for example, an acidic or alkaline chemical solution.

In the present exemplary embodiment, disk brushes are used as the lower surface brush 452C and the upper surface brush 453C, but roll brushes may be used. Further, sponges may be used instead of the brushes. In either case, the planarization layer 15 can be removed so that the second main surface 12 of the substrate 10 can be exposed. The cleaned substrate 10 is transferred by the transfer device 47 from the cleaning device 45C to the processing device 41C.

The substrate processing method of the present modification example includes a process S131 of dissolving and removing the planarization layer 15 with the solvent S by the cleaning device 45C. If the planarization layer 15 and the substrate 10 are greatly different from each other in material and there is no grinding tool capable of grinding both the planarization layer 15 and the substrate 10, the processing device 41B for grinding the planarization layer 15 only is not necessary. Further, if the planarization layer 15 is not formed on the second main surface 12, the process S131 of dissolving and removing the planarization layer 15 with the solvent S is not necessary.

Figure 16:
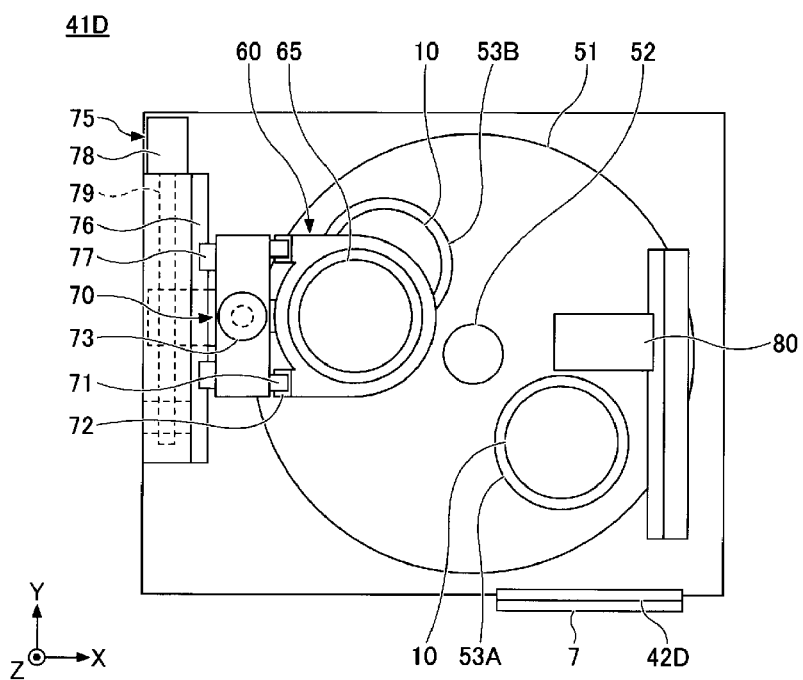
FIG. 16 is a top view illustrating a first modification example of the processing device.

FIG. 16 is a top view illustrating a first modification example of the processing device. A processing device 41D of the present modification example can be substituted by any one of the processing devices 41A, 41B and 41C of the above-described exemplary embodiment. That is, the processing device 41D of the present modification example may be any one of the first main surface grinding device, the planarization layer grinding device and the second main surface grinding device. The processing device 41D of the present modification example includes a rotary table 51, two chuck tables 53A and 53B, the driving unit 60, the elevating unit 70, a reciprocating unit 75 and the cleaning unit 80.

The rotary table 51 is rotated around a vertical rotational axis 52. The rotary table 51 is, for example, rotated clockwise by 180° when viewed from above and then counterclockwise by 180°. Since the arrangement of wiring and pipes fixed to the rotary table 51 is back to original state, the wiring and the pipes can be arranged easily.

The two chuck tables 53A and 53B are rotated around the rotational axis 52 of the rotary table 51 together with the rotary table 51. Each of the two chuck tables 53A and 53B has a substrate holding surface that horizontally holds the substrate 10 from below. The substrate holding surface has a larger diameter than the substrate 10 and attracts the entire lower surface of the substrate 10. If the processing device 41D serves as the first main surface grinding device, the two chuck tables 53A and 53B hold the substrate 10 from below with the first main surface 11 of the substrate 10 facing upwards. If the processing device 41D serves as the planarization layer grinding device or the second main surface grinding device, the two chuck tables 53A and 53B hold the substrate 10 from below with the second main surface 12 of the substrate 10 facing upwards.

The two chuck tables 53A and 53B are provided on the rotary table 51 so as to be rotatable around respective vertical rotational axes. Even in a state where the rotation of the rotary table 51 is stopped, the chuck tables 53A and 53B can rotate.

Figure 17A:
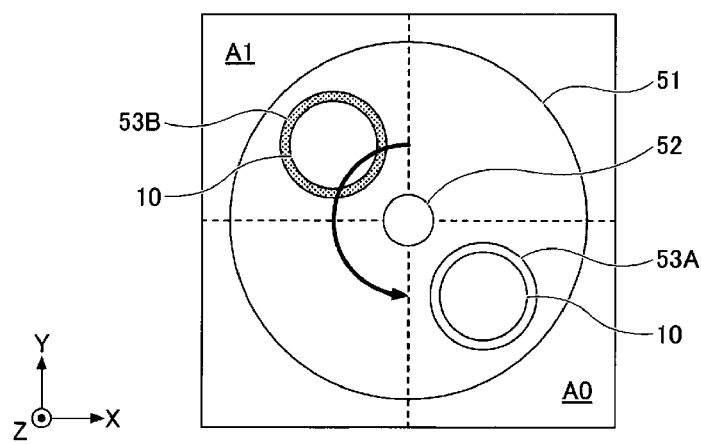
FIGS. 17A and 17B are top views illustrating an example of a positional change between two chuck tables shown in FIG. 16.
Figure 17B:
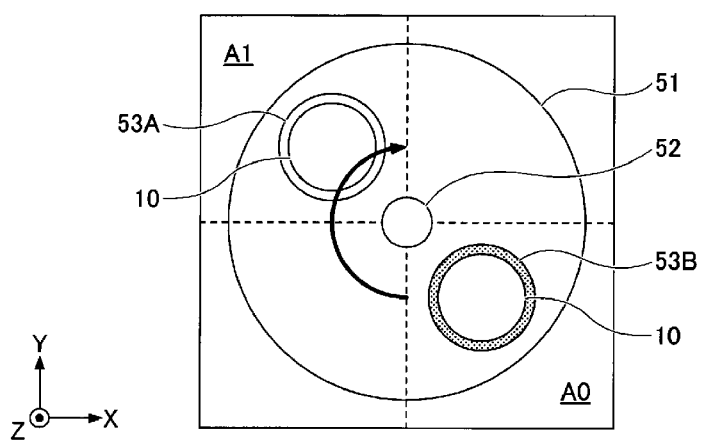

The two chuck tables 53A and 53B are placed at the same interval (180° interval) around the rotational axis 52 of the rotary table 51. As shown in FIGS. 17A and 17B, a delivery position A0 and a processing position A1 are located around the rotational axis 52 of the rotary table 51.

FIGS. 17A and 17B are top views illustrating an example of a positional change between the two chuck tables shown in FIG. 16. FIG. 17A is a top view illustrating an example of the positions of the two chuck tables when the rotary table shown in FIG. 17B is rotated counterclockwise by 180°. FIG. 17B is a top view illustrating an example of the positions of the two chuck tables when the rotary table shown in FIG. 17A is rotated clockwise by 180°.

The delivery position A0 and the processing position A1 are located around the rotational axis 52 of the rotary table 51. The two chuck tables 53A and 53B are placed symmetrically with respect to the rotational axis 52, and each of the chuck tables 53A and 53B moves between the delivery position A0 and the processing position A1.

The delivery position A0 is a position where the substrate 10 is delivered to the chuck tables 53A and 53B. The delivery position A0 serves as a position where the substrate 10 is delivered from the transfer device 47 to the chuck tables 53A and 53B and a position where the substrate 10 is delivered from the chuck tables 53A and 53B to the transfer device 47.

The processing position A1 is a position where the substrate 10 held on the chuck tables 53A and 53B is processed by a grinding tool 17. At the processing position A1, the grinding tool 17 provided on the driving unit 60 processes the first main surface 11 or the second main surface 12, which is the upper surface of the substrate 10. If the processing device 41D serves as the planarization layer grinding device, the grinding tool 17 processes the planarization layer 15. The processing position A1 and the delivery position A0 are located symmetrically with respect to the rotational axis 52.

The two chuck tables 53A and 53B are placed symmetrically with respect to the rotational axis 52, and each of the chuck tables 53A and 53B moves between the delivery position A0 and the processing position A1. When any one of the two chuck tables 53A and 53B is located at the delivery position A0, the other one is located at the processing position A1. Therefore, the processing of one substrate 10 and the delivery of another substrate 10 can be performed simultaneously, and, thus, the operating rate of the grinding tool 17 can be improved. Accordingly, the number of substrates 10 to be processed per unit time can be increased.

The delivery position A0 may also serve as a position where the substrate 10 is cleaned by the cleaning unit 80. The cleaning unit 80 cleans the upper surface of the substrate 10 before the substrate 10 processed at the processing position A1 is separated from the chuck tables 53A and 53B. The cleaning is performed by, for example, spray cleaning. In this case, the processing of the substrate 10 and the cleaning of the processed substrate 10 can be performed simultaneously.

The delivery position A0 may also serve as a position where the substrate holding surfaces of the chuck tables 53A and 53B are cleaned by the cleaning unit 80. The cleaning unit 80 cleans the exposed substrate holding surfaces after the substrate 10 processed at the processing position A1 is separated from the chuck tables 53A and 53B. The cleaning may be performed by any one or both of, for example, spray cleaning or scrubbing. In this case, the processing of the substrate 10 and the cleaning of the exposed substrate holding surface can be performed simultaneously.

As shown in FIGS. 17A and 17B, the delivery position A0 is located in front of the processing position A1 (in the negative Y-axis direction) and placed near a carry-in/out port 42D (see FIG. 16) through which the substrate 10 of the processing device 41D is carried in and out. Since the transfer device 47 carries the substrate 10 into and out of the processing device 41D from the front of the processing device 41D, the transfer device 47 can easily access the delivery position A0. Therefore, the delivery of the substrate 10 can be performed smoothly.

The carry-in/out port 42D is an opening formed at a wall of the processing device 41D facing the transfer section 46, i.e., a front surface of the processing device 41D. The wall of the processing device 41D facing the transfer section 46 is perpendicular to the Y-axis direction. The shutter 7 configured to open/close the carry-in/out port 42D may be provided in the carry-in/out port 42D. The shutter 7 opens the carry-in/out port 42D right before the transfer device 47 enters the processing device 41D from the transfer section 46, and closes the carry-in/out port 42D right after the transfer device 47 retreats from the processing device 41D to the transfer section 46. When the substrate 10 passes through the carry-in/out port 42D, the shutter 7 opens the carry-in/out port 42D. Meanwhile, when the processing device 41D processes the substrate 10, the shutter 7 closes the carry-in/out port 42D. Thus, it is possible to suppress an introduction of processing scraps generated within the processing device 41D to the transfer section 46.

As shown in FIG. 16, when viewed from above, a part of the chuck table 53B located at the processing position A1 is placed behind the grinding tool 17 provided on the driving unit 60 (for example, in the positive Y-axis direction). When the grinding tool 17 is replaced, a gap G between the grinding tool 17 and the chuck table 53B (see FIG. 19) can be seen from behind the processing device 41D. Therefore, the gap G can be adjusted easily and the maintainability is good.

Figure 18:
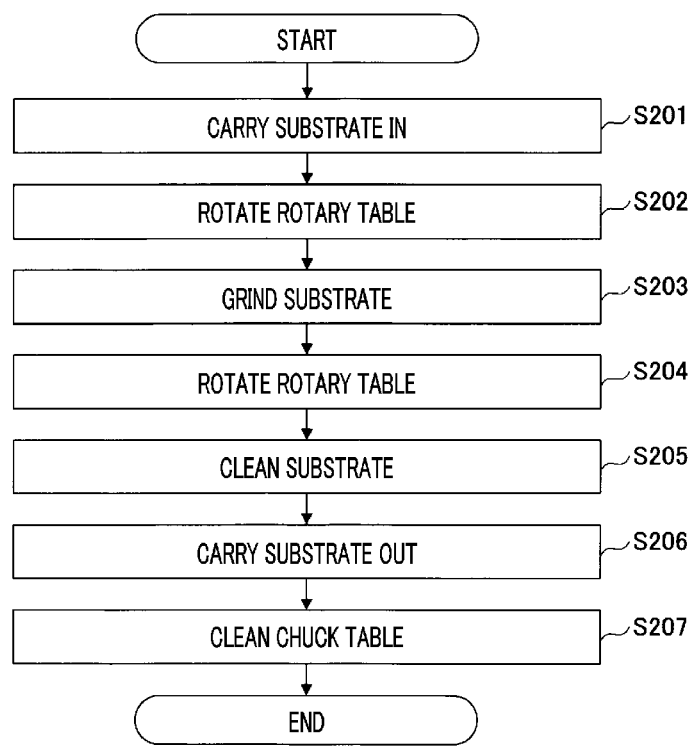
FIG. 18 is a flowchart showing an example of a processing using the positional change between two chuck tables shown in FIGS. 17A and 17B.

FIG. 18 is a flowchart showing an example of a processing using the positional change between two chuck tables shown in FIGS. 17A and 17B. The processing shown in FIG. 18 is a processing of the substrate 10 held on one chuck table 53A. At the start of performing the processing shown in FIG. 18, the two chuck tables 53A and 53B are located, for example, as shown in FIG. 17A. The processing shown in FIG. 18 is performed under the control of the control device 9.

The substrate processing method includes a process S201 of carrying the substrate 10 into the processing device 41D. In this process S201, the substrate 10 is delivered at the delivery position A0 from the transfer device 47 to the chuck table 53A. In parallel with this process S201, grinding of the substrate 10 held on the chuck table 53B is performed at the processing position A1.

The substrate processing method includes a process S202 of rotating the rotary table 51. The rotary table 51 shown in FIG. 17A is rotated clockwise by 180°, and the two chuck tables 53A and 53B move from the positions shown in FIG. 17A to the positions shown in FIG. 17B.

The substrate processing method includes a process S203 of grinding the substrate 10 held on the chuck table 53A at the processing position A1. In parallel with this process S203, cleaning of the substrate 10 held on the chuck table 53B and a delivery of the substrate 10 from the chuck table 53B to the transfer device 47 are performed at the delivery position A0. In addition, cleaning of the chuck table 53B and a delivery of the substrate 10 from the transfer device 47 to the chuck table 53B are performed at the delivery position A0.

The substrate processing method includes a process S204 of rotating the rotary table 51 again. The rotary table 51 shown in FIG. 17B is rotated counterclockwise by 180°, and the two chuck tables 53A and 53B move from the positions shown in FIG. 17B to the positions shown in FIG. 17A.

The substrate processing method includes a process S205 of cleaning the substrate 10 held on the chuck table 53A at the delivery position A0. Further, the substrate processing method includes a process S206 of delivering the substrate 10 from the chuck table 53A to the transfer device 47 at the delivery position A0 and carrying the substrate 10 out of the processing device 41D. Furthermore, the substrate processing method includes a process S207 of cleaning the chuck table 53A at the delivery position A0.

In parallel with these processes S205 to S207, grinding of the substrate 10 held on the chuck table 53B is performed at the processing position A1.

Thereafter, the processing shown in FIG. 18 is ended. The control device 9 may repeatedly perform the processing shown in FIG. 18.

Figure 19:
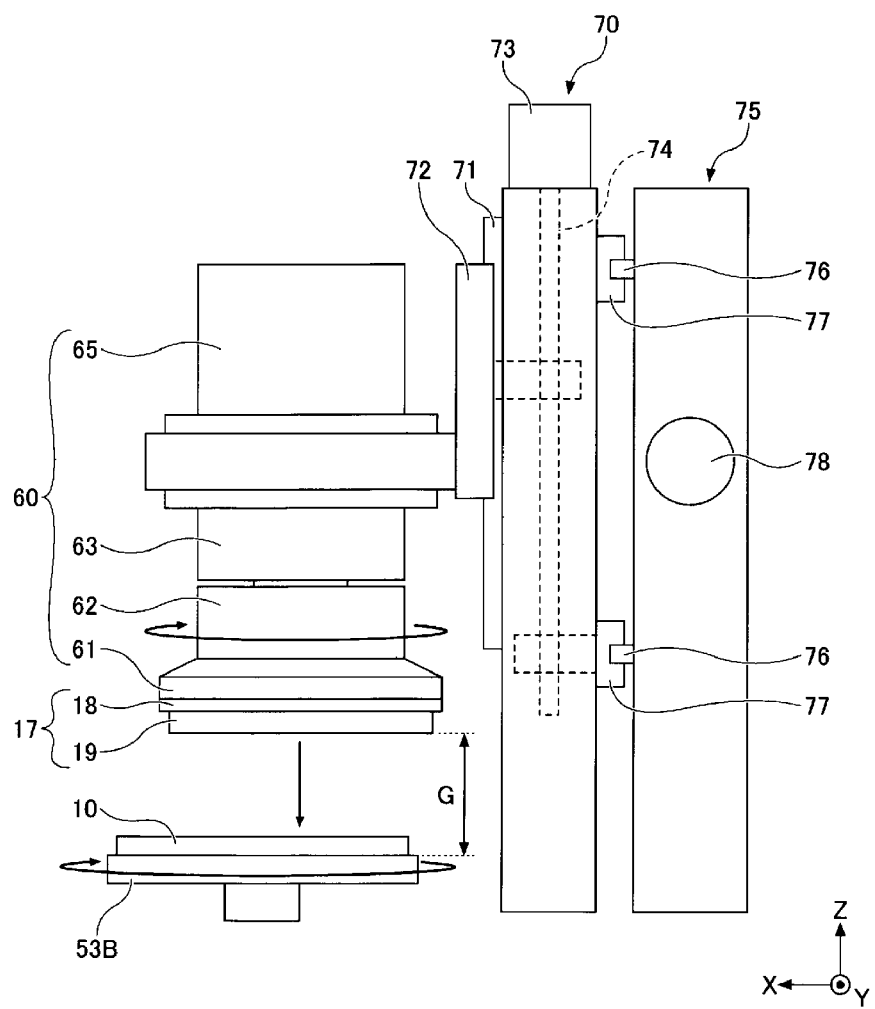
FIG. 19 is a rear view illustrating an example of a positional relationship among the driving unit, the elevating unit and a reciprocating unit shown in FIG. 16.

FIG. 19 is a rear view illustrating an example of the positional relationship among the driving unit, the elevating unit and a reciprocating unit shown in FIG. 16. The driving unit 60 is equipped with the grinding tool 17 for grinding the substrate 10 in the replaceable manner. The elevating unit 70 elevates the driving unit 60 in the vertical direction to move the grinding tool 17 provided on the driving unit 60 toward and away from the chuck table 53B.

As shown in FIG. 16, the processing device 41D has a rectangular outer shape when viewed from above, and has two sides parallel with the forward and backward direction (for example, the Y-axis direction). Further, as shown in FIG. 19, when viewed from directly behind the processing device 41D, the entire grinding tool 17 provided on the driving unit 60 is exposed from the elevating unit 70. That is, when viewed from directly behind the processing device 41D, the elevating unit 70 does not hide the grinding tool 17 provided on the driving unit 60. The grinding tool 17 can be replaced from behind the processing device 41D without being hindered by the elevating unit 70. Therefore, the grinding tool 17 can be replaced easily and the maintenance property is good.

As shown in FIG. 19, when viewed from directly behind the processing device 41D, the elevating unit 70 may be placed next to the driving unit 60 (for example, in the negative X-axis direction). The elevating unit 70 may be placed in front of or obliquely ahead of the driving unit 60. In either case, the entire grinding tool 17 provided on the driving unit 60 may be exposed from the elevating unit 70 when viewed from directly behind the processing device 41D.

Further, even if the entire grinding tool 17 provided on the driving unit 60 is not exposed from the elevating unit 70 when viewed from directly behind the processing device 41D, the entire grinding tool 17 provided on the driving unit 60 may be exposed from the elevating unit 70 when viewed obliquely from behind the processing device 41D. The grinding tool 17 can be replaced from behind the processing device 41D without being hindered by the elevating unit 70.

The reciprocating unit 75 moves the driving unit 60 in the forward and backward direction. The reciprocating unit 75 has a pair of Y-axis guides 76 extending in the Y-axis direction, a Y-axis slider 77 configured to reciprocate along the pair of Y-axis guides 76 and a Y-axis motor 78 configured to move the Y-axis slider 77 in the forward and backward direction. The elevating unit 70 is fixed to the Y-axis slider 77. The Y-axis motor 78 may perform a rotational movement or perform a linear movement. The reciprocating unit 75 has a ball screw 79 (see FIG. 16) configured to convert the rotational movement of the Y-axis motor 78 into a linear movement of the Y-axis slider 77 when the Y-axis motor 78 performs the rotational movement.

The reciprocating unit 75 aligns the circular orbits of the plurality of grindstones 19 arranged in the ring shape by moving the driving unit 60 in the forward and backward direction. This alignment is performed, for example, when the grinding tool 17 is replaced and when the sizes of the circular orbits are changed. The circular orbits are aligned to pass through the center of the substrate 10. Since the driving unit 60 can reciprocate, a plurality of types of grinding tools 17 with different circular orbit sizes can be used.

As shown in FIG. 19, when viewed from directly behind the processing device 41D, the entire grinding tool 17 provided on the driving unit 60 is exposed from the reciprocating unit 75. That is, when viewed from directly behind the processing device 41D, the reciprocating unit 75 does not hide the grinding tool 17 provided on the driving unit 60. The grinding tool 17 can be replaced from behind the processing device 41D without being hindered by the reciprocating unit 75. Therefore, the grinding tool 17 can be replaced easily and the maintenance property is good.

As shown in FIG. 19, when viewed from directly behind the processing device 41D, the reciprocating unit 75 may be placed next to the driving unit 60 (for example, in the negative X-axis direction). The reciprocating unit 75 may be placed in front of or obliquely ahead of the driving unit 60. In either case, the entire grinding tool 17 provided on the driving unit 60 may be exposed from the reciprocating unit 75 when viewed from directly behind the processing device 41D.

In addition, even if the entire grinding tool 17 provided on the driving unit 60 is not exposed from the reciprocating unit 75 when viewed from directly behind the processing device 41D, the entire grinding tool 17 provided on the driving unit 60 needs to be exposed from the reciprocating unit 75 when viewed obliquely from behind the processing device 41D. The grinding tool 17 can be replaced from behind the processing device 41D without being hindered by the reciprocating unit 75.

The processing device 41D of the present exemplary embodiment has the reciprocating unit 75 so that a plurality of types of grinding tools 17 with different circular orbit sizes can be used, but the present disclosure is not limited thereto. If the circular orbits of the grinding tool 17 are set to one size, the processing device 41D may not have the reciprocating unit 75. If there is no reciprocating unit 75, the processing device 41D can be reduced in size in the X-axis direction.

Figure 20:
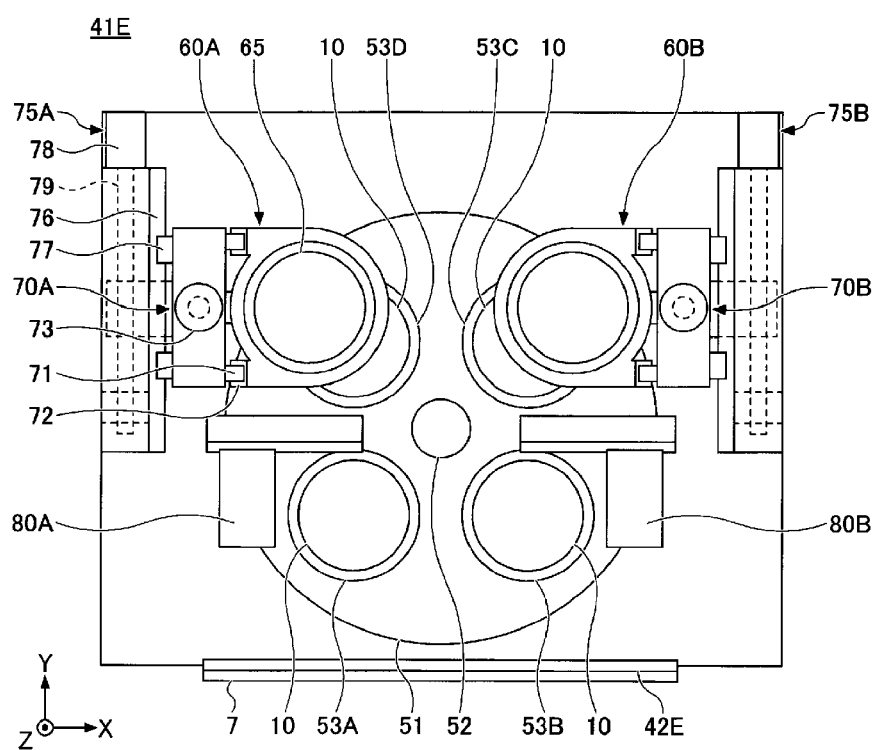
FIG. 20 is a top view illustrating a second modification example of the processing device.

FIG. 20 is a top view illustrating a second modification example of the processing device. A processing device 41E of the present modification example can be substituted by any one of the processing devices 41A, 41B and 41C of the above-described exemplary embodiment. That is, the processing device 41E of the present modification example may be any one of the first main surface grinding device, the planarization layer grinding device and the second main surface grinding device. The processing device 41E of the present modification example includes the rotary table 51, four chuck tables 53A, 53B, 53C and 53D, two driving units 60A and 60B, two elevating units 70A and 70B, two reciprocating units 75A and 75B, and two cleaning units 80A and 80B.

The rotary table 51 is rotated around a vertical rotational axis 52. The rotary table 51 is, for example, rotated clockwise by 180° when viewed from above and then counterclockwise by 180°. Since the arrangement of wiring and pipes fixed to the rotary table 51 is back to original state, the wiring and the pipes can be arranged easily.

The four chuck tables 53A, 53B, 53C and 53D are rotated around the rotational axis 52 of the rotary table 51 together with the rotary table 51. Each of the four chuck tables 53A, 53B, 53C and 53D has a substrate holding surface configured to horizontally hold the substrate 10 from below. The substrate holding surface has a larger diameter than the substrate 10 and attracts the entire lower surface of the substrate 10. If the processing device 41E serves as the first main surface grinding device, the four chuck tables 53A, 53B, 53C and 53D hold the substrate 10 from below with the first main surface 11 of the substrate 10 facing upwards. If the processing device 41E serves as the planarization layer grinding device or the second main surface grinding device, the four chuck tables 53A, 53B, 53C and 53D hold the substrate 10 from below with the second main surface 12 of the substrate 10 facing upwards.

The four chuck tables 53A, 53B, 53C and 53D are provided on the rotary table 51 so as to be rotatable around respective vertical rotational axes. Even in a state where the rotation of the rotary table 51 is stopped, the four chuck tables 53A, 53B, 53C and 53D can rotate.

Figure 21A:
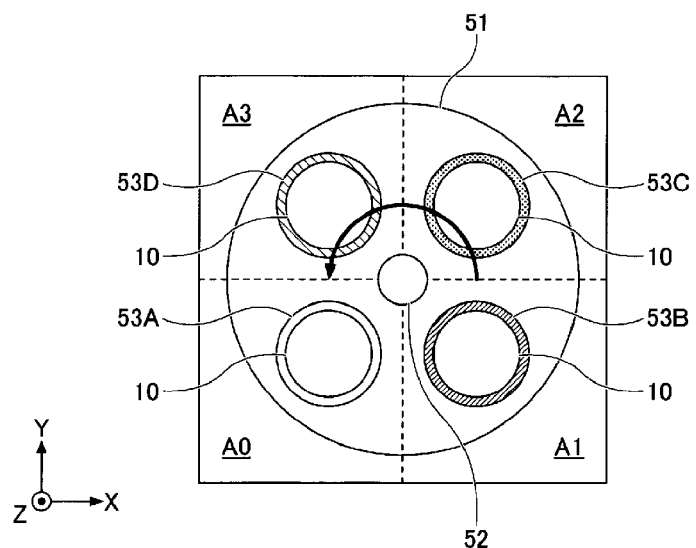
FIGS. 21A and 21B are top views illustrating an example of a positional change among four chuck tables shown in FIG. 20.
Figure 21B:
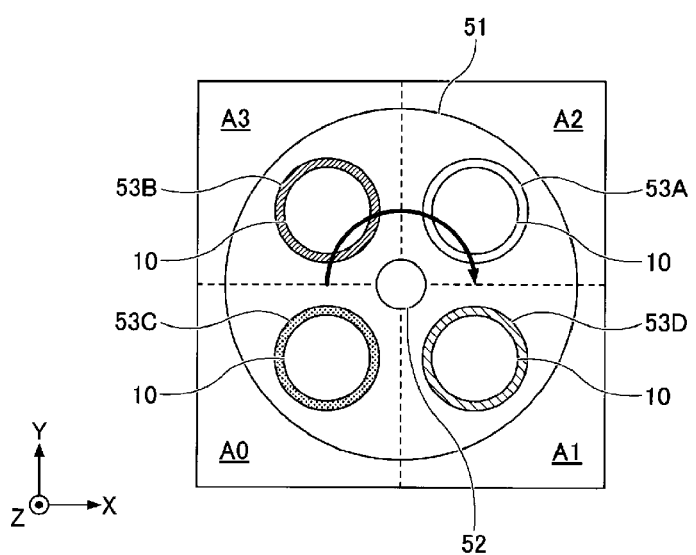

The four chuck tables 53A, 53B, 53C, 53D are placed at the same interval (90° interval) around the rotational axis 52 of the rotary table 51. As shown in FIGS. 21A and 21B, a first delivery position A0, a second delivery position A1, a first processing position A2 and a second processing position A3 are located around the rotational axis 52 of the rotary table 51.

FIGS. 21A and 21B are top views illustrating an example of a positional change among four chuck tables shown in FIG. 20. FIG. 21A is a top view illustrating an example of the positions of the four chuck tables when the rotary table shown in FIG. 21B is rotated counterclockwise by 180°. FIG. 21B is a top view illustrating an example of the positions of the four chuck tables when the rotary table shown in FIG. 21A is rotated clockwise by 180°.

The first delivery position A0, the second delivery position A1, the first processing position A2 and the second processing position A3 are located in this order in a counterclockwise direction around the rotational axis 52 of the rotary table 51. The order of arrangement may be reversed, and the first delivery position A0, the second delivery position A1, the first processing position A2 and the second processing position A3 may be located in this order in a clockwise direction.

A pair of chuck tables 53A and 53C are placed symmetrically with respect to the rotational axis 52, and each of the chuck tables 53A and 53C moves between the first delivery position A0 and the first processing position A2. Further, the other pair of chuck tables 53B and 53D are placed symmetrically with respect to the rotational axis 52, and each of the chuck tables 53B and 53D moves between the second delivery position A1 and the second processing position A3.

The first delivery position A0 is a position where the substrate 10 is delivered to the pair of chuck tables 53A and 53C. The first delivery position A0 serves as a position where the substrate 10 is delivered from the transfer device 47 to the chuck tables 53A and 53C and a position where the substrate 10 is delivered from the chuck tables 53A and 53C to the transfer device 47.

The first processing position A2 is a position where the substrate 10 held on the pair of chuck tables 53A and 53C is processed by the grinding tool 17. At the first processing position A2, the grinding tool 17 provided on the driving unit 60B processes the first main surface 11 or the second main surface 12, which is the upper surface of the substrate 10. If the processing device 41E serves as the planarization layer grinding device, the grinding tool 17 processes the planarization layer 15. The first processing position A2 and the first delivery position A0 are located symmetrically with respect to the rotational axis 52.

The pair of chuck tables 53A and 53C are placed symmetrically with respect to the rotational axis 52, and each of the chuck tables 53A and 53C moves between the first delivery position A0 and the first processing position A2. When any one of the pair of chuck tables 53A and 53C is located at the first delivery position A0, the other one is located at the first processing position A2. Therefore, the processing of one substrate 10 and the delivery of another substrate 10 can be performed simultaneously, and, thus, the operating rate of the grinding tool 17 can be improved. Accordingly, the number of substrates 10 to be processed per unit time can be increased.

The first delivery position A0 may also serve as a position where the substrate 10 is cleaned by the cleaning unit 80A. The cleaning unit 80A cleans the upper surface of the substrate 10 before the substrate 10 processed at the first processing position A2 is separated from the chuck tables 53A and 53C. The cleaning is performed by, for example, spray cleaning. In this case, the processing of the substrate 10 and the cleaning of the processed substrate 10 can be performed simultaneously.

The first delivery position A0 may also serve as a position where the substrate holding surfaces of the chuck tables 53A and 53C are cleaned by the cleaning unit 80A. The cleaning unit 80A cleans the exposed substrate holding surfaces after the substrate 10 processed at the first processing position A2 is separated from the chuck tables 53A and 53C. The cleaning may be performed by any one or both of, for example, spray cleaning or scrubbing. In this case, the processing of the substrate 10 and the cleaning of the exposed substrate holding surface can be performed simultaneously.

The second delivery position A1 is a position where the substrate 10 is delivered to the pair of chuck tables 53B and 53D. The second delivery position A1 serves as a position where the substrate 10 is delivered from the transfer device 47 to the chuck tables 53B and 53D and a position where the substrate 10 is delivered from the chuck tables 53B and 53D to the transfer device 47.

The second processing position A3 is a position where the substrate 10 held on the pair of chuck tables 53B and 53D is processed by the grinding tool 17. At the second processing position A3, the grinding tool 17 provided on the driving unit 60A processes the first main surface 11 or the second main surface 12, which is the upper surface of the substrate 10. If the processing device 41E serves as the planarization layer grinding device, the grinding tool 17 processes the planarization layer 15. The second processing position A3 and the second delivery position A1 are located symmetrically with respect to the rotational axis 52.

The pair of chuck tables 53B and 53D are placed symmetrically with respect to the rotational axis 52, and each of the chuck tables 53B and 53D moves between the second delivery position A1 and the second processing position A3. When any one of the pair of chuck tables 53B and 53D is located at the second delivery position A1, the other one is located at the second processing position A3. Therefore, the processing of one substrate 10 and the delivery of another substrate 10 can be performed simultaneously, and, thus, the operating rate of the grinding tool 17 can be improved. Accordingly, the number of substrates 10 to be processed per unit time can be increased.

The second delivery position A1 may also serve as a position where the substrate 10 is cleaned by the cleaning unit 80B. The cleaning unit 80B cleans the upper surface of the substrate 10 before the substrate 10 processed at the second processing position A3 is separated from the chuck tables 53B and 53D. The cleaning is performed by, for example, spray cleaning. In this case, the processing of the substrate 10 and the cleaning of the processed substrate 10 can be performed simultaneously.

The second delivery position A1 may also serve as a position where the substrate holding surfaces of the chuck tables 53B and 53D are cleaned by the cleaning unit 80B. The cleaning unit 80B cleans the exposed substrate holding surfaces after the substrate 10 processed at the second processing position A3 is separated from the chuck tables 53B and 53D. The cleaning may be performed by any one or both of, for example, spray cleaning or scrubbing. In this case, the processing of the substrate 10 and the cleaning of the exposed substrate holding surface can be performed simultaneously.

As illustrated in FIGS. 21A and 21B, when viewed from above, the first delivery position A0 and the second delivery position A1 are located in front of the first processing position A2 and the second processing position A3 (in the negative Y-axis direction) and placed near a carry-in/out port 42E (see FIG. 20) through which the substrate 10 of the processing device 41E is carried in and out. Since the transfer device 47 carries the substrate 10 into and out of the processing device 41E from the front of the processing device 41E, the transfer device 47 can easily access the first delivery position A0 and the second delivery position A1. Therefore, the delivery of the substrate 10 can be performed smoothly.

The carry-in/out port 42E is an opening formed at a wall of the processing device 41E facing the transfer section 46, i.e., a front surface of the processing device 41E. The wall of the processing device 41E facing the transfer section 46 is perpendicular to the Y-axis direction. The shutter 7 configured to open/close the carry-in/out port 42E may be provided in the carry-in/out port 42E. The shutter 7 opens the carry-in/out port 42E right before the transfer device 47 enters the processing device 41E from the transfer section 46, and closes the carry-in/out port 42E right after the transfer device 47 retreats from the processing device 41E to the transfer section 46. When the substrate 10 passes through the carry-in/out port 42E, the shutter 7 opens the carry-in/out port 42E. Meanwhile, when the processing device 41ED processes the substrate 10, the shutter 7 closes the carry-in/out port 42E. Thus, it is possible to suppress an introduction of processing scraps generated within the processing device 41E to the transfer section 46.

Figure 22:
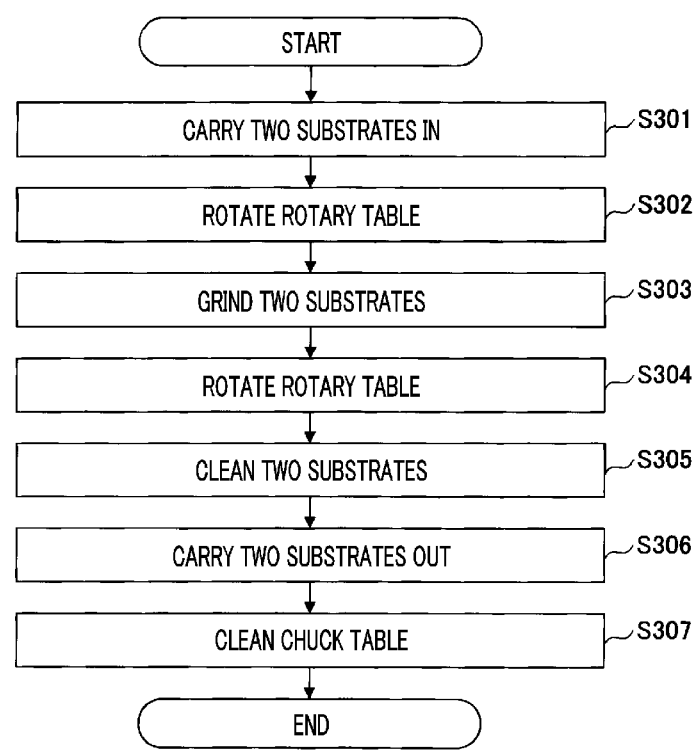
FIG. 22 is a flowchart showing an example of a processing using the positional change among the four chuck tables shown in FIGS. 21A and 21B.

FIG. 22 is a flowchart showing an example of a processing using the positional change among four chuck tables shown in FIGS. 21A and 21B. The processing shown in FIG. 22 is a processing of the substrate 10 held on the two chuck tables 53A and 53B. At the start of performing the process shown in FIG. 22, the four chuck tables 53A, 53B, 53C and 53D are located, for example, as shown in FIG. 21A. The processing shown in FIG. 22 is performed under the control of the control device 9.

The substrate processing method includes a process S301 of carrying two substrates 10 into the processing device 41E. In this process S301, the substrates 10 are delivered at the first delivery position A0 and the second delivery position A1 from the transfer device 47 to the chuck tables 53A and 53B. In parallel with this process S301, the grinding of two substrates 10 held on the chuck tables 53C and 53D is performed at the first processing position A2 and the second processing position A3.

The substrate processing method includes a process S302 of rotating the rotary table 51. The rotary table 51 shown in FIG. 21A is rotated clockwise by 180°, and the four chuck tables 53A, 53B, 53C and 53D move from the positions shown in FIG. 21A to the positions shown in FIG. 21B.

The substrate processing method includes a process S303 of grinding the two substrates 10 held on the chuck tables 53A and 53B at the first processing position A2 and the second processing position A3. In parallel with this process S303, the cleaning of the two substrates 10 held on the chuck tables 53C and 53D and the delivery of the substrates 10 from the chuck tables 53C and 53D to the transfer device 47 are performed at the first delivery position A0 and the second delivery position A1. In addition, the cleaning of the chuck tables 53C and 53D and the delivery of the substrates 10 from the transfer device 47 to the chuck tables 53C and 53D are performed at the first delivery position A0 and the second delivery position A1.

The substrate processing method includes a process S304 of rotating the rotary table 51 again. The rotary table 51 shown in FIG. 21B is rotated counterclockwise by 180°, and the four chuck tables 53A, 53B, 53C and 53D move from the positions shown in FIG. 21B to the positions shown in FIG. 21A.

The substrate processing method includes a process S305 of cleaning the two substrates 10 held on the chuck tables 53A and 53B at the first delivery position A0 and the second delivery position A1. Further, the substrate processing method includes a process S306 of delivering the substrates 10 from the chuck tables 53A and 53B to the transfer device 47 at the first delivery position A0 and the second delivery position A1 and carrying the two substrates 10 out of the processing device 41E. Furthermore, the substrate processing method includes a process S307 of cleaning the chuck tables 53A and 53B at the first delivery position A0 and the second delivery position A1.

In parallel with these processes S305 to S307, the grinding of the two substrates 10 held on the chuck tables 53C and 53D is performed at the first processing position A2 and the second processing position A3.

Thereafter, the processing shown in FIG. 22 is ended. The control device 9 may repeatedly perform the processing shown in FIG. 22.

Figure 23A:
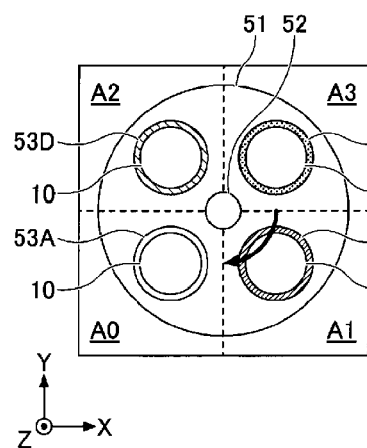
FIGS. 23A to 23D are top views illustrating another example of the positional change among the four chuck tables shown in FIG. 20.
Figure 23B:
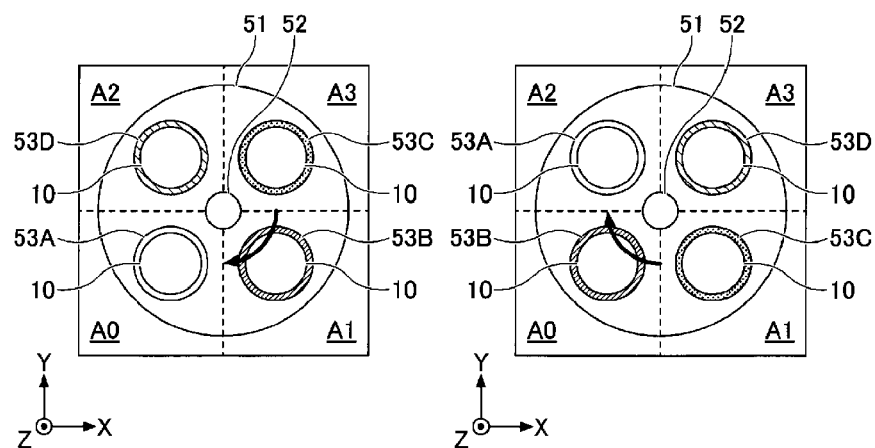
Figure 23C:
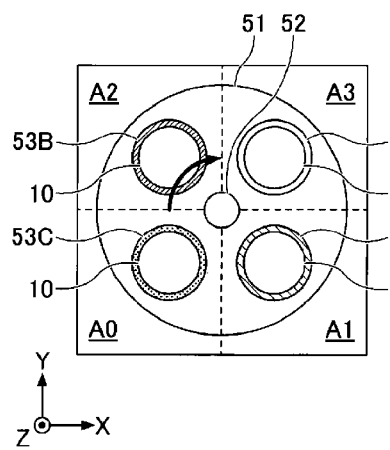
Figure 23D:
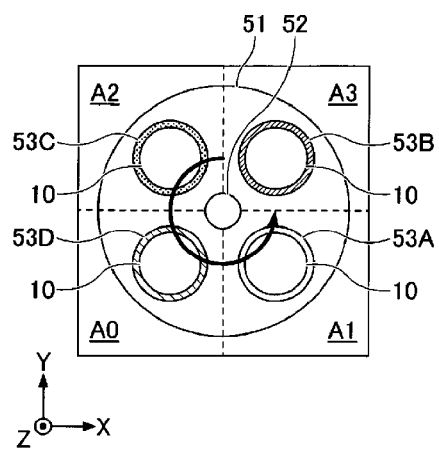

FIGS. 23A to 23D are top views illustrating another example of the positional change among the four chuck tables shown in FIG. 20. FIG. 23A is a top view illustrating an example of the positions of the four chuck tables when the rotary table shown in FIG. 23D is rotated clockwise by 90°. FIG. 23B is a top view illustrating an example of the positions of the four chuck tables when the rotary table shown in FIG. 23A is rotated clockwise by 90°. FIG. 23C is a top view illustrating an example of the positions of the four chuck tables when the rotary table shown in FIG. 23B is rotated clockwise by 90°. FIG. 23D is a top view illustrating an example of the positions of the four chuck tables when the rotary table shown in FIG. 23C is rotated counterclockwise by 270°.

The first delivery position A0, the first processing position A2, the second processing position A3 and the second delivery position A1 are located in this order in a clockwise direction around the rotational axis 52 of the rotary table 51. The order of arrangement may be reversed, and the first delivery position A0, the first processing position A2, the second processing position A3 and the second delivery position A1 may be located in this order in a counterclockwise direction. Each of the four chuck tables 53A, 53B, 53C and 53D moves among the first delivery position A0, the first processing position A2, the second processing position A3 and the second delivery position A1 in this order.

The first delivery position A0 is a position where the substrate 10 is delivered from the transfer device 47 to the chuck tables 53A, 53B, 53C and 53D.

The first processing position A2 is a position where the substrate 10 held on the chuck tables 53A, 53B, 53C and 53D is primarily processed by the grinding tool 17. At the first processing position A2, the grinding tool 17 provided on the driving unit 60A primarily processes the upper surface of the substrate 10.

The second processing position A3 is a position where the substrate 10 held on the chuck tables 53A, 53B, 53C and 53D is secondarily processed by the grinding tool 17. At the second processing position A3, the grinding tool 17 provided on the driving unit 60B secondarily processes the upper surface of the substrate 10.

The grinding tool 17 for the primary processing and the grinding tool 17 for the secondary processing may have abrasive grains with the same average grain size or different average grain sizes. In the latter case, the grinding tool 17 for the secondary processing may have abrasive grains with a smaller average grain size than the grinding tool 17 for the primary processing.

The second delivery position A1 is a position where the substrate 10 is delivered from the chuck tables 53A, 53B, 53C and 53D to the transfer device 47.

The second delivery position A1 may also serve as a position where the substrate 10 is cleaned by the cleaning unit 80B. The cleaning unit 80B cleans the upper surface of the substrate 10 before the substrate 10 processed at the second processing position A3 is separated from the chuck tables 53A, 53B, 53C and 53D. The cleaning is performed by, for example, spray cleaning. In this case, the processing of the substrate 10 and the cleaning of the processed substrate 10 can be performed simultaneously.

The second delivery position A1 may also serve as a position where the substrate holding surfaces of the chuck tables 53A, 53B, 53C and 53D are cleaned by the cleaning unit 80B. The cleaning unit 80 cleans the exposed substrate holding surfaces after the substrate 10 processed at the second processing position A3 is separated from the chuck tables 53A, 53B, 53C and 53D. The cleaning may be performed by any one or both of, for example, spray cleaning or scrubbing. In this case, the processing of the substrate 10 and the cleaning of the exposed substrate holding surface can be performed simultaneously.

The cleaning of the substrate holding surfaces of the chuck tables 53A, 53B, 53C and 53D may be performed at the first delivery position A0 instead of the second delivery position A1, and may be performed by the cleaning unit 80A.

As shown in FIGS. 23A to 23D, when viewed from above, the first delivery position A0 and the second delivery position A1 are located in front of the first processing position A2 and the second processing position A3 (in the negative Y-axis direction) and placed near the carry-in/out port 42E (see FIG. 20) through which the substrate 10 of the processing device 41E is carried in and out. Since the transfer device 47 carries the substrate 10 into and out of the processing device 41E from the front of the processing device 41E, the transfer device 47 can easily access the first delivery position A0 and the second delivery position A1. Therefore, the delivery of the substrate 10 can be performed smoothly.

Figure 24:
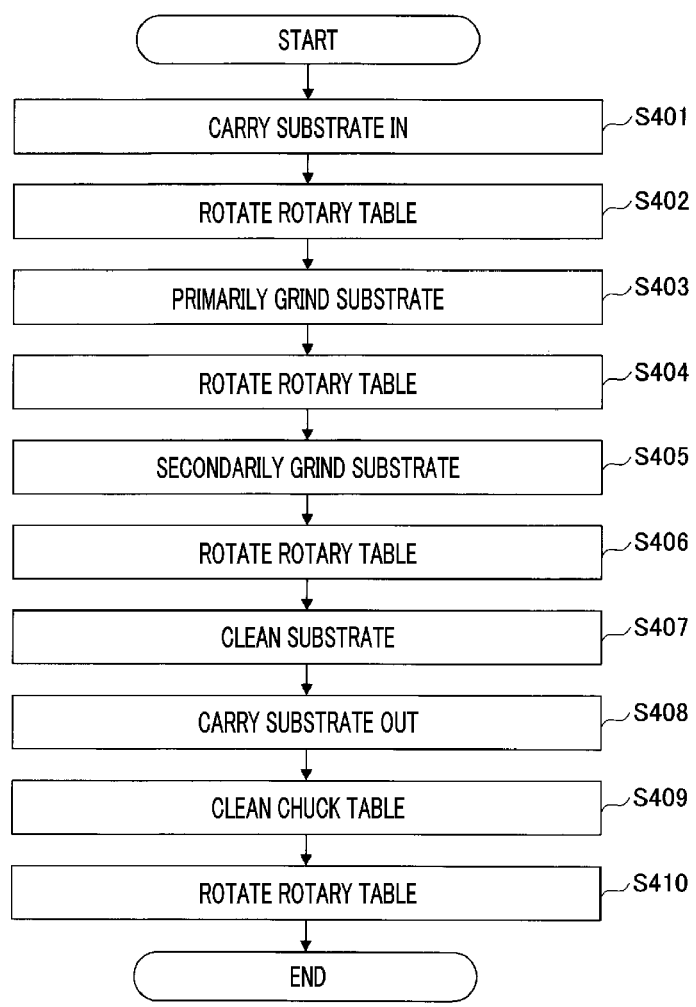
FIG. 24 is a flowchart showing an example of a processing using the positional change among the four chuck tables shown in FIGS. 23A to 23D.

FIG. 24 is a flowchart showing an example of a processing using the positional change among the four chuck tables shown in FIGS. 23A to 23D. The processing shown in FIG. 24 is a processing of the substrate 10 held on the one chuck table 53A. At the start of performing the process shown in FIG. 24, the four chuck tables 53A, 53B, 53C and 53D are located, for example, as shown in FIG. 23A. The processing shown in FIG. 24 is performed under the control of the control device 9.

The substrate processing method includes a process S401 of carrying the substrate 10 into the processing device 41E. In this process S401, the substrate 10 is delivered at the first delivery position A0 from the transfer device 47 to the chuck table 53A. In parallel with this process S401, the primary grinding of the substrate 10 held on the chuck table 53D is performed at the first processing position A2. Further, in parallel with this process S401, the secondary grinding of the substrate 10 held on the chuck table 53C is performed at the second processing position A3. Furthermore, in parallel with this process S401, the cleaning of the substrate 10 held on the chuck table 53B and the delivery of the substrate 10 from the chuck table 53B to the transfer device 47 are performed at the second delivery position A1. In addition, the cleaning of the chuck table 53B may be performed at the second delivery position A1.

The substrate processing method includes a process S402 of rotating the rotary table 51. The rotary table 51 shown in FIG. 23A is rotated clockwise by 90°, and the four chuck tables 53A, 53B, 53C and 53D move from the positions shown in FIG. 23A to the positions shown in FIG. 23B.

The substrate processing method includes a process S403 of primarily grinding the substrate 10 held on the chuck table 53A at the first processing position A2. In parallel with this process S403, the secondary grinding of the substrate 10 held on the chuck table 53D is performed at the second processing position A3. Also, in parallel with this process S403, the cleaning of the substrate 10 held on the chuck table 53C and the delivery of the substrate 10 from the chuck table 53C to the transfer device 47 are performed at the second delivery position A1. In addition, the cleaning of the chuck table 53C may be performed at the second delivery position A1. Further, in parallel with this process S403, the delivery of the substrate 10 from the transfer device 47 to the chuck table 53B is performed at the first delivery position A0.

The substrate processing method includes a process S404 of rotating the rotary table 51. The rotary table 51 shown in FIG. 23B is rotated clockwise by 90°, and the four chuck tables 53A, 53B, 53C and 53D move from the positions shown in FIG. 23B to the positions shown in FIG. 23C.

The substrate processing method includes a process S405 of secondarily grinding the substrate 10 held on the chuck table 53A at the second processing position A3. Also, in parallel with this process S405, the cleaning of the substrate 10 held on the chuck table 53D and the delivery of the substrate 10 from the chuck table 53D to the transfer device 47 are performed at the second delivery position A1. In addition, the cleaning of the chuck table 53D may be performed at the second delivery position A1. Further, in parallel with this process S405, the delivery of the substrate 10 from the transfer device 47 to the chuck table 53C is performed at the first delivery position A0. Furthermore, in parallel with this process S405, the primary grinding of the substrate 10 held on the chuck table 53B is performed at the first processing position A2.

The substrate processing method includes a process S406 of rotating the rotary table 51. The rotary table 51 shown in FIG. 23C is rotated counterclockwise by 270°, and the four chuck tables 53A, 53B, 53C and 53D move from the positions shown in FIG. 23C to the positions shown in FIG. 23D.

The substrate processing method includes a process S407 of cleaning the substrate 10 held on the chuck table 53A at the second delivery position A1. Further, the substrate processing method includes a process S408 of delivering the substrate 10 from the chuck table 53A to the transfer device 47 at the second delivery position A1 and carrying the substrate 10 out of the processing device 41E. Furthermore, the substrate processing method includes a process S409 of cleaning the chuck table 53A at the second delivery position A1.

In parallel with these processes S407 to S409, the delivery of the substrate 10 from the transfer device 47 to the chuck table 53D is performed at the first delivery position A0. Further, in parallel with these processes S407 to S409, the primary grinding of the substrate 10 held on the chuck table 53C is performed at the first processing position A2. Furthermore, in parallel with these processes S407 to S409, the secondary grinding of the substrate 10 held on the chuck table 53B is performed at the second processing position A3.

The substrate processing method includes a process S410 of rotating the rotary table 51. The rotary table 51 shown in FIG. 23D is rotated clockwise by 90°, and the four chuck tables 53A, 53B, 53C and 53D move from the positions shown in FIG. 23D to the positions shown in FIG. 23A.

Thereafter, the processing shown in FIG. 24 is ended. The control device 9 may repeatedly perform the processing shown in FIG. 24.

According to the processing device 41E of the present modification example, as shown in FIGS. 21A and 21B and FIGS. 23A to 23D, the two delivery positions A0 and A1 and the two processing positions A2 and A3 are located around the rotational axis 52 of the one rotary table 51. Therefore, the number of rotary tables used is smaller than when using two rotary tables each having a rotational axis around which one delivery position and one processing position are located. Therefore, the installation area of the processing device 41E can be reduced, and the installation area of the substrate processing system 1 can also be reduced.

Figure 25:
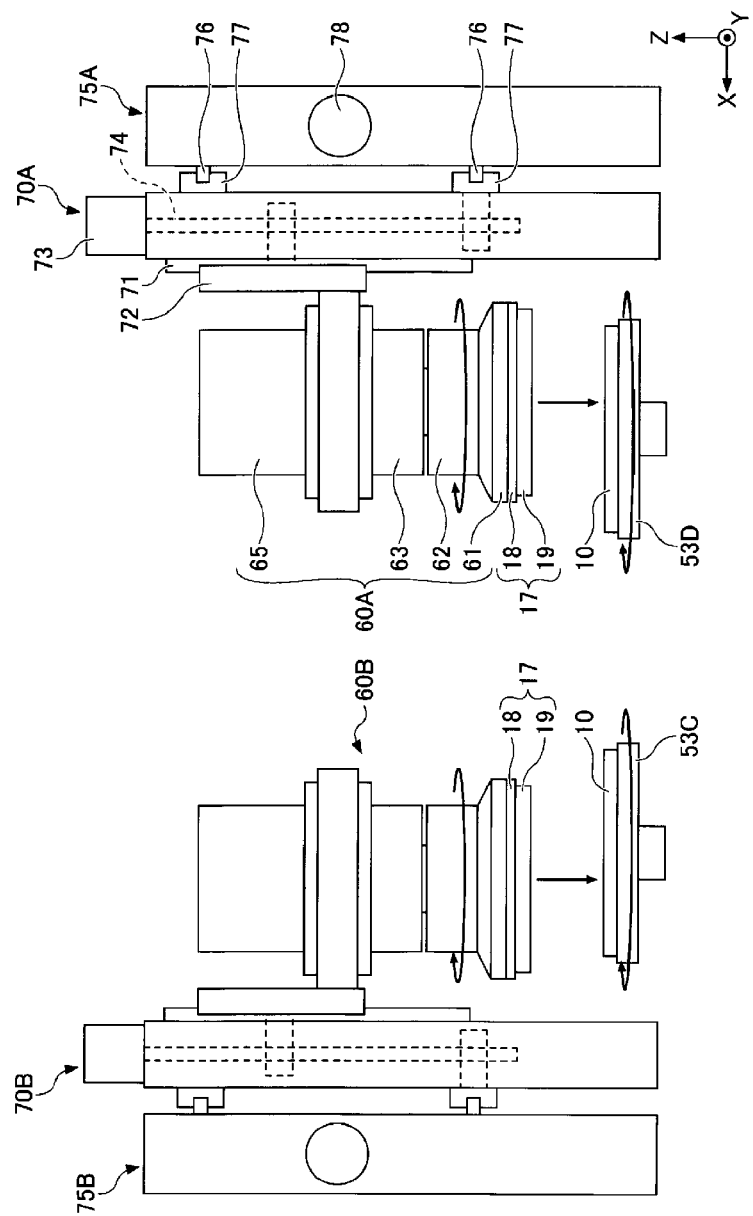
FIG. 25 is a rear view illustrating an example of a positional relationship among two driving units, two elevating units and two reciprocating units shown in FIG. 20.

FIG. 25 is a rear view illustrating an example of the positional relationship among the two driving units, the two elevating units and the two reciprocating units shown in FIG. 20. Each of the two driving units 60A and 60B is equipped with the grinding tool 17 for grinding the substrate 10 in the replaceable manner. The two elevating units 70A and 70B elevate the two driving units 60A and 60B independently in the vertical direction. The elevating unit 70A elevates the driving unit 60A in the vertical direction, and the elevating unit 70B elevates the driving unit 60B in the vertical direction.

As shown in FIG. 20, the processing device 41E has a rectangular outer shape when viewed from above, and has two sides parallel with the forward and backward direction (for example, the Y-axis direction). Further, as shown in FIG. 25, when viewed from directly behind the processing device 41E, the entire grinding tool 17 provided on the driving unit 60A is exposed from the elevating unit 70A. That is, the elevating unit 70A does not hide the grinding tool 17 provided on the driving unit 60A when viewed from directly behind the processing device 41E. The grinding tool 17 can be replaced from behind the processing device 41E without being hindered by the elevating unit 70A. Therefore, the grinding tool 17 can be replaced easily and the maintainability is good.

As shown in FIG. 25, when viewed from directly behind the processing device 41E, the elevating unit 70A may be placed next to the driving unit 60A (for example, in the negative X-axis direction). The elevating unit 70A may be placed in front of or obliquely ahead of the driving unit 60A. In either case, the entire grinding tool 17 provided on the driving unit 60A may be exposed from the elevating unit 70A when viewed from directly behind the processing device 41E.

Further, even if the entire grinding tool 17 provided on the driving unit 60A is not exposed from the elevating unit 70A when viewed from directly behind the processing device 41E, the entire grinding tool 17 provided on the driving unit 60A needs to be exposed from the elevating unit 70A when viewed obliquely from behind the processing device 41E. The grinding tool 17 can be replaced from behind the processing device 41E without being hindered by the elevating unit 70A.

The two reciprocating units 75A and 75B move the two driving units 60A and 60B independently in the forward and backward direction. The reciprocating unit 75A moves the driving unit 60A in the forward and backward direction, and the reciprocating unit 75B moves the driving unit 60B in the forward and backward direction.

As shown in FIG. 25, when viewed from directly behind the processing device 41E, the entire grinding tool 17 provided on the driving unit 60A is exposed from the reciprocating unit 75A. That is, the reciprocating unit 75A does not hide the grinding tool 17 provided on the driving unit 60A when viewed from directly behind the processing device 41E. The grinding tool 17 can be replaced from behind the processing device 41E without being hindered by the reciprocating unit 75A. Therefore, the grinding tool 17 can be replaced easily and the maintainability is good.

As shown in FIG. 25, when viewed from directly behind the processing device 41E, the reciprocating unit 75A may be placed next to the driving unit 60A (for example, in the negative X-axis direction). The reciprocating unit 75A may be placed in front of or obliquely ahead of the driving unit 60A. In either case, the entire grinding tool 17 provided on the driving unit 60A may be exposed from the reciprocating unit 75A when viewed from directly behind the processing device 41E.

Further, even if the entire grinding tool 17 provided on the driving unit 60A is not exposed from the reciprocating unit 75A when viewed from directly behind the processing device 41E, the entire grinding tool 17 provided on the driving unit 60A needs to be exposed from reciprocating unit 75A when viewed obliquely from behind the processing device 41E. The grinding tool 17 can be replaced from behind the processing device 41E without being hindered by the reciprocating unit 75A.

The processing device 41E of the present exemplary embodiment has the reciprocating units 75A and 75B so that a plurality of types of grinding tools 17 with different circular orbit sizes can be used, but the present disclosure is not limited thereto. If the circular orbits of the grinding tool 17 are set to one size, the processing device 41E may not have the reciprocating units 75A and 75B. If there are no reciprocating units 75A and 75B, the processing device 41E can be reduced in size in the X-axis direction.

Although the exemplary embodiments of the substrate processing system and the substrate processing method have been described above, the present disclosure is not limited to the above-described exemplary embodiments. Various changes, modifications, substitutions, additions, deletions and combinations may be made within the scope of the claims. Of course, such changes, modifications, substitutions, additions, deletions and combinations belong to the technical scope of the present disclosure.

The substrate 10 is not limited to a semiconductor substrate such as a silicon wafer, but may be a glass substrate or the like. The substrate 10 has the first main surface and the second main surface facing each other, and when the first main surface is ground, the second main surface may be protected in advance by another substrate or a resin tape.

The present application is based on Japanese Patent Application No. 2018-156673 filed with the Japanese Patent Office on Aug. 23, 2018, the entire contents of which are hereby incorporated herein by reference.

EXPLANATION OF REFERENCE NUMERALS

According to an aspect of the present disclosure, it is possible to systematically grind both surfaces of the substrate flat.

I claim:
1. A substrate processing system, comprising:
a first main surface grinding device configured to grind, while holding a substrate from below with a first main surface of the substrate facing upwards, the first main surface of the substrate;
a first inverting device configured to invert the substrate ground by the first main surface grinding device; and
a second main surface grinding device configured to grind, while holding the ground first main surface of the substrate from below with a second main surface of the substrate facing upwards, the second main surface of the substrate.
2. The substrate processing system of claim 1,
wherein the first main surface grinding device has a chuck table configured to hold the substrate from below with the first main surface of the substrate facing upwards; a driving unit equipped with a grinding tool allowed to be replaced; and an elevating unit configured to elevate the driving unit.

3. The substrate processing system of claim 2, further comprising:
a transfer device configured to carry the substrate into and out of the first main surface grinding device from a front of the first main surface grinding device when viewed from above,
wherein the grinding tool provided on the driving unit is entirely exposed from the elevating unit when viewed from directly behind or when viewed obliquely from behind the first main surface grinding device.

4. The substrate processing system of claim 2,
wherein the first main surface grinding device has a horizontal guide configured to guide the chuck table in a forward and backward direction,
a delivery position and a processing position are located along the horizontal guide, the delivery position is a position where a delivery of the substrate is performed with respect to the chuck table, and the processing position is a position where the substrate held on the chuck table is processed by the grinding tool.

5. The substrate processing system of claim 2,
wherein the first main surface grinding device has a rotary table configured to be rotated around a vertical rotational axis,
the chuck table has two chuck tables, and the two chuck tables are placed at a same interval around the rotational axis of the rotary table and rotated together with the rotary table,
a delivery position and a processing position are located around the rotational axis of the rotary table, the delivery position is a position where a delivery of the substrate is performed with respect to the chuck table, and the processing position is a position where the substrate held on the chuck table is processed by the grinding tool.

6. The substrate processing system of claim 2,
wherein the first main surface grinding device has a rotary table configured to be rotated around a vertical rotational axis,
the chuck table has four chuck tables, and the four chuck tables are placed at a same interval around the rotational axis of the rotary table and rotated together with the rotary table,
a first delivery position, a second delivery position, a first processing position and a second processing position are located around the rotational axis of the rotary table, each of the first delivery position and the second delivery position is a position where a delivery of the substrate is performed with respect to the chuck table, and each of the first processing position and the second processing position is a position where the substrate held on the chuck table is processed by the grinding tool.

7. The substrate processing system of claim 2,
wherein the elevating unit of the first main surface grinding device has a portal frame that straddles a movement path of the chuck table; a pair of elevating guides fixed to the portal frame; and a pair of elevating sliders configured to move up and down along the pair of elevating guides,
the driving unit is fixed to the pair of elevating sliders, and the driving unit has a spindle motor configured to rotate the grinding tool, and
the pair of elevating sliders are arranged symmetrically with respect to a rotational axis of the spindle motor.

8. The substrate processing system of claim 1,
wherein the first main surface grinding device holds a flat surface of a planarization layer, which is formed on the second main surface of the substrate, from below with the first main surface of the substrate facing upwards and grinds the first main surface of the substrate.

9. The substrate processing system of claim 8, further comprising:
a planarization layer grinding device configured to grind, while holding the ground first main surface of the substrate from below with the second main surface of the substrate facing upwards, the planarization layer.

10. The substrate processing system of claim 8,
wherein the second main surface grinding device has a driving unit equipped with a grinding tool, which is allowed to be replaced and configured to grind both the planarization layer and the second main surface of the substrate; and an elevating unit configured to elevate the driving unit.

11. The substrate processing system of claim 8, further comprising:
a cleaning device configured to remove, while holding the substrate with the second main surface of the substrate facing upwards, the planarization layer by dissolving the planarization layer with a solvent.

12. The substrate processing system of claim 1, further comprising:
a second main surface etching device configured to etch, while holding the substrate with the ground second main surface of the substrate facing upwards, the ground second main surface of the substrate.

13. The substrate processing system of claim 12, further comprising:
a second inverting device configured to invert the substrate etched by the second main surface etching device; and
a first main surface etching device configured to etch, while holding the substrate with the ground first main surface of the substrate facing upwards, the ground first main surface of the substrate.

14. A substrate processing method, comprising:
taking a substrate out of a carrier placed in a carrier placing section;
grinding, while holding the substrate taken out of the carrier from below with a first main surface of the substrate facing upwards, the first main surface of the substrate;
inverting the substrate of which the first main surface is ground;
grinding, while holding the ground first main surface of the substrate from below with a second main surface of the substrate facing upwards, the second main surface of the substrate; and
carrying the substrate, of which the second main surface is ground, into the carrier placed in the carrier placing section.

15. The substrate processing method of claim 14,
wherein the grinding of the first main surface of the substrate includes holding a flat surface of a planarization layer, which is formed on the second main surface of the substrate taken out of the carrier, from below with the first main surface of the substrate facing upwards; and grinding the first main surface of the substrate.

16. The substrate processing method of claim 15, further comprising:
grinding, while holding the ground first main surface of the substrate from below with the second main surface of the substrate facing upwards, the planarization layer by a grinding tool different from a grinding tool configured to grind the second main surface of the substrate.

17. The substrate processing method of claim 15, further comprising:
grinding, while holding the ground first main surface of the substrate from below with the second main surface of the substrate facing upwards, the planarization layer by a grinding tool configured to grind the second main surface of the substrate.

18. The substrate processing method of claim 15, further comprising:
dissolving and removing the planarization layer with a solvent while holding the substrate with the second main surface of the substrate facing upwards.

19. The substrate processing method of claim 14, further comprising:
etching, while holding the substrate with the ground second main surface of the substrate facing upwards, the ground second main surface of the substrate.

20. The substrate processing method of claim 19, further comprising:
inverting the substrate of which the second main surface is etched; and
etching, while holding the substrate with the ground first main surface of the substrate facing upwards, the ground first main surface of the substrate.

* * * * *